United States Patent
Jun et al.

(10) Patent No.: US 10,312,299 B2
(45) Date of Patent: Jun. 4, 2019

(54) DISPLAY DEVICE

(71) Applicant: Samsung Display Co., Ltd., Yongin-Si, Gyeonggi-Do (KR)

(72) Inventors: Sanghyun Jun, Suwon-si (KR); Kiho Bang, Hwaseong-si (KR); Eunae Jung, Hwaseong-si (KR); Keunlim Ku, Hwaseong-si (KR); Mi-ran Ji, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 28 days.

(21) Appl. No.: 15/662,105

(22) Filed: Jul. 27, 2017

(65) Prior Publication Data

US 2018/0033834 A1 Feb. 1, 2018

(30) Foreign Application Priority Data

Jul. 29, 2016 (KR) .................. 10-2016-0097498

(51) Int. Cl.
*G06F 3/041* (2006.01)
*H01L 27/32* (2006.01)
(Continued)

(52) U.S. Cl.
CPC ............ *H01L 27/323* (2013.01); *G06F 3/044* (2013.01); *G06F 3/0412* (2013.01);
(Continued)

(58) Field of Classification Search
CPC ............... H01L 27/323; H01L 51/5253; H01L 51/5256; H01L 2251/5338; H01L 27/3244;
(Continued)

(56) References Cited

U.S. PATENT DOCUMENTS

2012/0062486 A1 3/2012 Rho
2012/0068994 A1 3/2012 Li et al.
(Continued)

FOREIGN PATENT DOCUMENTS

EP 2840460 A1 2/2015
EP 2881782 A2 6/2015
(Continued)

OTHER PUBLICATIONS

EPO Extended Search Report dated Nov. 22, 2017, for corresponding European Patent Application No. 17183505.1 (14 pages).
(Continued)

*Primary Examiner* — Adam R Giesy
(74) *Attorney, Agent, or Firm* — Lewis Roca Rothgerber Christie LLP

(57) ABSTRACT

A display device includes an organic light emitting display panel defining a display area for displaying an image and a non-display area adjacent the display area, and including a base layer, a circuit layer on the base layer, a light emitting device layer on the circuit layer, and a thin film sealing layer on the light emitting device layer and divided into a first thin film sealing area, and a second thin film sealing area adjacent the first thin film sealing area, and a touch detection unit including a first sensor part on the first thin film sealing area of the thin film sealing layer, and a second sensor part on the second thin film sealing area of the thin film sealing layer, wherein an upper surface of the thin film sealing layer that faces the touch detection unit includes a first upper surface in the first thin film sealing area, and a second upper surface in the second thin film sealing area and protruding away from the base layer.

25 Claims, 23 Drawing Sheets

(51) Int. Cl.
*G06F 3/044* (2006.01)
*H01L 51/52* (2006.01)

(52) U.S. Cl.
CPC ...... *H01L 51/5253* (2013.01); *H01L 51/5256* (2013.01); *G06F 2203/04102* (2013.01); *G06F 2203/04107* (2013.01); *G06F 2203/04111* (2013.01); *G06F 2203/04112* (2013.01); *H01L 27/3244* (2013.01); *H01L 2251/5338* (2013.01)

(58) Field of Classification Search
CPC ............. G06F 3/044; G06F 3/0412; G06F 2203/04102; G06F 2203/04103; G06F 2203/04107; G06F 2203/04112; G06F 2203/04111; G09G 3/3208; G09G 3/3216; G09G 3/3225; G09G 3/3258
See application file for complete search history.

(56) References Cited

U.S. PATENT DOCUMENTS

| | | | |
|---|---|---|---|
| 2014/0084257 | A1 | 3/2014 | Kim et al. |
| 2014/0319481 | A1 | 10/2014 | Lee et al. |
| 2015/0014636 | A1 | 1/2015 | Kang |
| 2015/0091012 | A1 | 4/2015 | Namkung et al. |
| 2015/0144913 | A1 | 5/2015 | Shim |
| 2015/0147532 | A1 | 5/2015 | Nam et al. |
| 2016/0027808 | A1 | 1/2016 | Kim |
| 2016/0048248 | A1 | 2/2016 | Na et al. |
| 2016/0103537 | A1 | 4/2016 | Park et al. |
| 2016/0204171 | A1 | 7/2016 | Lee et al. |
| 2016/0209959 | A1 | 7/2016 | Lee et al. |
| 2017/0351358 | A1* | 12/2017 | Matsumoto ............. G06F 3/044 |
| 2017/0365813 | A1* | 12/2017 | Kamiya ................ G06F 3/0412 |

FOREIGN PATENT DOCUMENTS

| | | |
|---|---|---|
| KR | 10-2015-0007866 A | 1/2015 |
| KR | 10-2016-0000853 A | 1/2016 |
| KR | 10-2016-0041708 | 4/2016 |
| KR | 10-2016-0043230 A | 4/2016 |

OTHER PUBLICATIONS

European Patent Office Extended Search Report, dated May 2, 2019, for Patent Application No. EP19167481.1, 15 pages.

* cited by examiner

DISPLAY DEVICE

CROSS-REFERENCE TO RELATED APPLICATION

This patent application claims priority to, and the benefit of, Korean Patent Application No. 10-2016-0097498, filed on Jul. 29, 2016, the entire contents of which are hereby incorporated by reference.

BACKGROUND

The present disclosure herein relates to a display device including a touch detection unit.

Various display devices used for multimedia devices, such as televisions, mobile phones, tablet computers, navigations, and game consoles, are being developed. A keyboard or a mouse is included as an input device of a display device. Additionally, recent display devices include touch detection units as input devices.

SUMMARY

The present disclosure provides a display device including a touch detection unit.

An embodiment of the inventive concept provides a display device including an organic light emitting display panel defining a display area for displaying an image and a non-display area adjacent the display area, and including a base layer, a circuit layer on the base layer, a light emitting device layer on the circuit layer, and a thin film sealing layer on the light emitting device layer and divided into a first thin film sealing area, and a second thin film sealing area adjacent the first thin film sealing area, and a touch detection unit including a first sensor part on the first thin film sealing area of the thin film sealing layer, and a second sensor part on the second thin film sealing area of the thin film sealing layer, wherein an upper surface of the thin film sealing layer that faces the touch detection unit includes a first upper surface in the first thin film sealing area, and a second upper surface in the second thin film sealing area and protruding away from the base layer.

The touch detection unit may be directly on the thin film sealing layer.

The first thin film sealing area and the second thin film sealing area may overlap the display area on a plane, and the second thin film sealing area may be between the first thin film sealing area and the non-display area on a plane.

The second sensor part may be curved corresponding to a form of the second upper surface.

An average distance between the first upper surface and the base layer may be a first distance, and a maximum distance between the second upper surface and the base layer may be a second distance that is greater than the first distance.

A minimum distance between the second upper surface and the base layer may be a third distance that is less than the first distance.

An average interval between each of a plurality of points in the first sensor part and the base layer may have a first interval, and an average of distances between each of a plurality of points in the second sensor part and the base layer may be substantially identical to the first interval.

The thin film sealing layer may include a first inorganic layer on the light emitting device layer, a first organic layer on the first inorganic layer, and a second inorganic layer on the first organic layer.

An upper surface of the first organic layer contacting the second inorganic layer may include a first surface in the first thin film sealing area, and a second surface in the second thin film sealing area and protruding away from the base layer.

The thin film sealing layer may further include a second organic layer on the second inorganic layer, and a third inorganic layer on the second organic layer.

An upper surface of at least one of the first organic layer and the second organic layer may include a first surface in the first thin film sealing area, and a second surface in the second thin film sealing area and protruding away from the base layer.

The thin film sealing layer may further include an organic coating layer in the second thin film sealing area and between the second inorganic layer and the second sensor part, the organic coating layer including an upper surface protruding away from the base layer.

The first sensor part and the second sensor part may be on the same layer.

The second upper surface of the thin film sealing layer may include a peak having the furthest distance from the base layer, a first inclined surface connecting the first upper surface and the peak and extending away from the base layer, and a second inclined surface extending from the peak to the base layer.

The second thin film sealing area may surround the first thin film sealing area on a plane, and the peak may overlap the second sensor part on a plane.

An embodiment of the inventive concept provides a display device including a base layer, a circuit layer on the base layer, a light emitting device layer on the circuit layer, a thin film sealing layer on the light emitting device layer, and divided into a first thin film sealing area including a first upper surface, and a second thin film sealing area including a second upper surface having a peak that protrudes from a reference surface, which is an extension of the first upper surface, in a direction away from the base layer, a first sensor part on the first upper surface, and a second sensor part on the second upper surface, curved corresponding to a form of the second upper surface, and overlapping the peak.

The second thin film sealing area may surround the first thin film sealing area on a plane.

An average distance between the first upper surface and the base layer may be a first distance, a distance between the peak and the base layer may be a second distance that is greater than the first distance, and a minimum distance between the second upper surface and the base layer may be a third distance that is less than the first distance.

The thin film sealing layer may include at least one organic layer, and a form of the second upper surface may correspond to the at least one organic layer.

The first sensor part and the second sensor part may be on the same layer.

An embodiment of the inventive concept provides a display device including an organic light emitting display panel, where a display area for displaying an image and a non-display area adjacent to the display area are defined, the organic light emitting display panel including a base layer, a circuit layer on the base layer, a light emitting device layer on the circuit layer, and a thin film sealing layer on the light emitting device layer and divided into a first thin film sealing area, and a second thin film sealing area adjacent to the first thin film sealing area, and a touch detection unit including touch electrodes on the first thin film sealing area and the second thin film sealing area, wherein the second thin film sealing area includes a peak having a furthest distance from the base layer, and wherein a peripheral touch electrode closest to the non-display area among the touch electrodes overlaps the peak.

The touch electrodes may include M first touch electrodes extending along a first direction and arranged sequentially along a second direction crossing the first direction, and N second touch electrodes extending along the second direction and arranged sequentially along the first direction, and the peak may overlap the 1st first touch electrode and the Mth first touch electrode.

The peak may overlap the 1st second touch electrode and the Nth second touch electrode.

An average distance between an upper surface of the first thin film sealing area facing the touch detection unit and the base layer may be a first distance, and a distance between the peak and the base layer may be greater than the first distance.

The thin film sealing layer may include at least one organic layer, and the peak may be provided by adjusting a thickness of the organic layer.

BRIEF DESCRIPTION OF THE DRAWINGS

The accompanying drawings are included to provide a further understanding of the inventive concept, and are incorporated in, and constitute a part of, this specification. The drawings illustrate exemplary embodiments of the inventive concept and, together with the description, serve to explain principles of the inventive concept.

In the drawings.

DETAILED DESCRIPTION

Figure 1A:
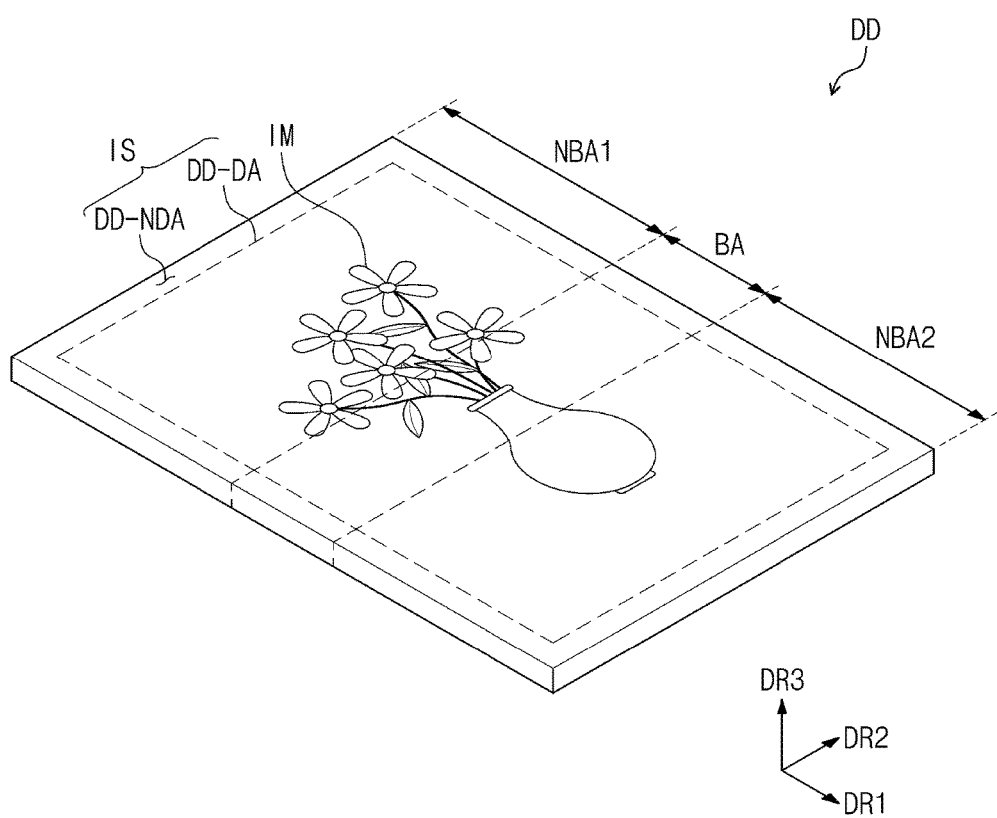
FIG. 1A is a perspective view according to a first operation of a display device according to an embodiment of the inventive concept.

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
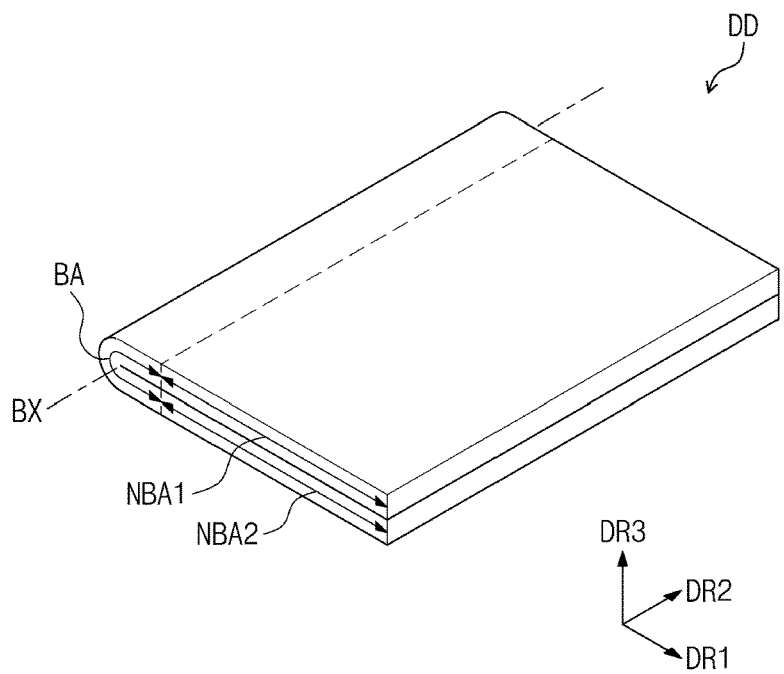
FIG. 1B is a perspective view according to a second operation of a display device according to an embodiment of the inventive concept.
Figure 1C:
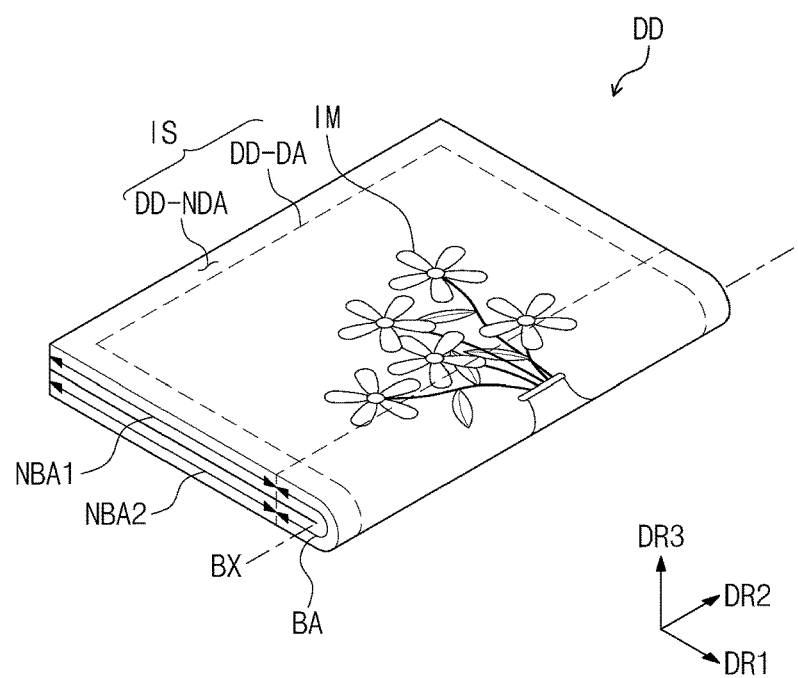
FIG. 1C is a perspective view according to a third operation of a display device according to an embodiment of the inventive concept.

FIG. 1A is a perspective view according to a first operation of a display device DD according to an embodiment of the inventive concept. FIG. 1B is a perspective view according to a second operation of the display device DD according to an embodiment of the inventive concept. FIG. 1C is a perspective view according to a third operation of the display device DD according to an embodiment of the inventive concept.

As shown in FIG. 1A, in a first operating mode, a display surface IS where an image IM is displayed is parallel to a surface that a first direction DR1 and a second direction DR2 define. The normal direction of the display surface IS, that is, a thickness direction of the display device DD, indicates a third direction DR3. A front surface (or an upper surface) and a rear surface (or a lower surface) of each member are divided with respect to the third direction DR3. However, the directions that the first to third directions DR1, DR2, and DR3 indicate may be converted to other directions as a relative concept. Hereinafter, first to third directions as directions, which the respective first to third directions DR1, DR2, and DR3 indicate, refer to the same reference numerals.

FIGS. 1A to 1C illustrate a flexible foldable display device as one example of the display device DD. However, the inventive concept may relate to a rollable display device or a bended display device, and is not particularly limited. Additionally, although a flexible display device is shown in this embodiment, the inventive concept is not limited thereto. The display device DD according to this embodiment may be a flat rigid display device or a curved rigid display device. The display device DD may be used for small and medium-sized electronic devices, such as mobile phones, tablets, car navigations, game consoles, and smart watches, in addition to large-sized electronic devices, such as televisions and monitors.

As shown in FIG. 1A, the display surface IS of the display device DD may include a plurality of areas. The display device DD may include a display area DD-DA where an image IM is displayed, and a non-display area DD-NDA adjacent to the display area DD-DA. The non-display area DD-NDA is an area where no image is displayed. FIG. 1A illustrates a vase as one example of the image IM. As one example, the display area DD-DA may have a rectangular form. The non-display area DD-NDA may surround the display area DD-DA. However, the inventive concept is not limited thereto, and a form of the display area DD-DA and a form of the non-display area DD-NDA may be designed relatively.

As shown in FIGS. 1A to 1C, the display device DD may include a plurality of areas defined according to an operation form. The display device DD may include a bending area BA that may be bent on the basis of a bending axis BX, and may also include a first non-bending area NBA1 and a second non-bending area NBA2.

As shown in FIG. 1B, the display device DD may be inner-bending/inward bending to allow a display surface IS of the first non-bending area NBA1 and a display surface IS of the second non-bending area NBA2 to face each other. As shown in FIG. 1C, the display device DD may be outer-bending/outward bending to allow the display surface IS to be exposed to the outside.

Although only one bending area BA is shown in FIGS. 1A to 1C, the inventive concept is not limited thereto For example, according to an embodiment of the inventive concept, the display device DD may include a plurality of bending areas BA.

According to an embodiment of the inventive concept, the display device DD may be configured to operate only in the operating mode shown in FIGS. 1A and 1B. However, the inventive concept is not limited thereto, and the bending area BA may correspond to a form that a user manipulates the display device DD. For example, unlike FIGS. 1B and 1C, the bending area BA may be defined parallel to the first direction DR1 or may be defined in a diagonal direction in other embodiments. An area of the bending area BA is not fixed, and may be determined according to the radius of curvature.

Figure 2:
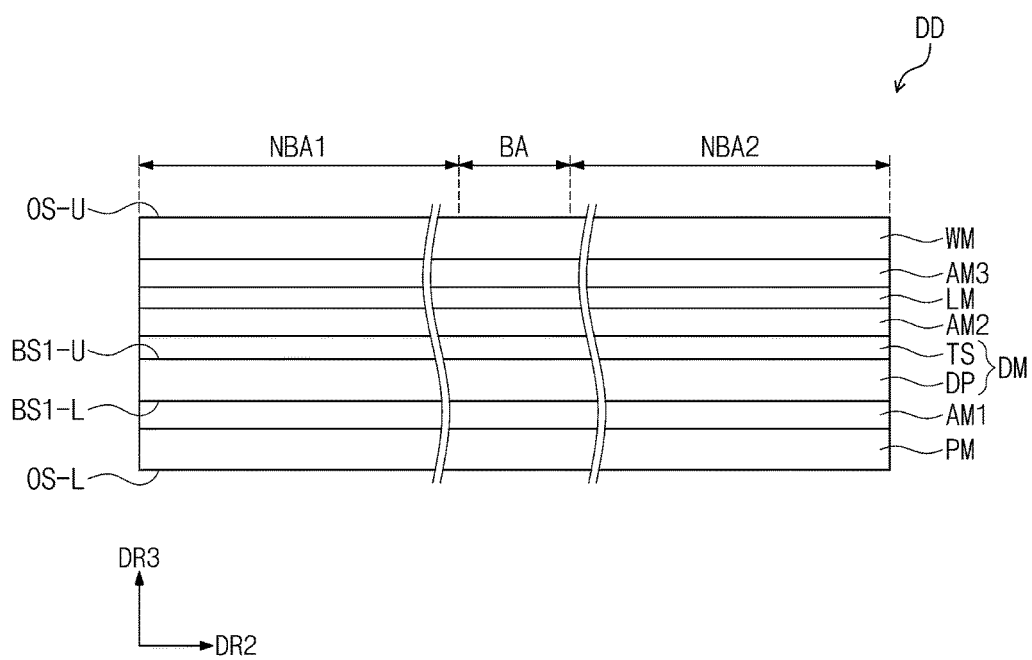
FIG. 2 is a sectional view of a display device according to an embodiment of the inventive concept.

FIG. 2 is a sectional view of a display device DD according to an embodiment of the inventive concept. FIG. 2 shows a section that a second direction DR2 and a third direction DR3 define.

As shown in FIG. 2, the display device DD includes a protective film PM, a display module DM, an optical member LM, a window WM, a first adhesive member AM1, a second adhesive member AM2, and a third adhesive member AM3. The display module DM is located between the protective film PM and the optical member LM. The optical member LM is located between the display module DM and the window WM. The first adhesive member AM1 bonds the display module DM and the protective film PM, the second adhesive member AM2 bonds the display module DM and the optical member LM, and the third adhesive member AM3 bonds the optical member LM and the window WM.

The protective film PM protects the display module DM. The protective film PM provides a first outer surface OS-L exposed to the outside, and provides an adhesive surface adhering to the first adhesive member AM1. The protective film PM prevents external moisture from penetrating the display module DM and absorbs external impact.

The protective film PM may include a plastic film as a base substrate. The protective film PM may include a plastic film including one selected from the group consisting of polyethersulfone (PES), polyacrylate, polyetherimide (PEI), polyethylenenaphthalate (PEN), polyethyleneterephthalate (PET), polyphenylene sulfide (PPS), polyarylate, polyimide (PI), polycarbonate (PC), poly(arylene ethersulfone), and a combination thereof.

A material constituting the protective film PM is not limited to plastic resins, and may include an organic/inorganic composite material. The protective film PM may include an inorganic material filled in the pores of a porous organic layer, and an organic layer. The protective film PM may further include a functional layer formed at a plastic film. The functional layer may include a resin layer. The functional layer may be formed through a coating method. According to an embodiment of the inventive concept, the protective film PM may be omitted.

The window WM may protect the display module DM from an external impact and provide an input surface to a user. The window WM provides a second outer surface OS-U exposed to the outside, and provides an adhesive surface adhering to the second adhesive member AM2. The display surface IS shown in FIGS. 1A to 1C may be the second outer surface OS-U.

The window WM may include a plastic film. The window WM may have a multilayer structure. The window WM may have a multilayer structure selected from a glass substrate, a plastic film, and a plastic substrate. The window WM may further include a bezel pattern. The multilayer structure may be formed through a continuous process or an adhering process using an adhesive layer.

The optical member LM reduces an external light reflectance. The optical member LM may include at least a polarizing film. The optical member LM may further include a phase difference film. According to an embodiment of the inventive concept, the optical member LM may be omitted.

The display module DM may include an organic light emitting display panel (or a display panel) DP and a touch detection unit TS. The touch detection unit TS is directly located on the organic light emitting display panel DP. In this specification, "directly located" means "being formed" through a continuous process, excluding "attached" through an additional adhesive layer.

The organic light emitting display panel DP generates the image IM (see FIG. 1A) corresponding to inputted image data. The organic light emitting display panel DP provides a first display panel surface BS1-L and a second display panel surface BS1-U facing in a thickness direction DR3. In this embodiment, although the organic light emitting display panel DP is described as an example, the display panel is not limited thereto.

The touch detection unit TS obtains coordinate information of an external input. The touch detection unit TS may detect an external input through a capacitance method.

Although not shown separately, the display module DM according to an embodiment of the inventive concept may further include an anti-reflective layer. The anti-reflective layer may include a color filter or a layer-stacked structure of conductive layer/insulation layer/conductive layer. The anti-reflective layer may reduce an external light reflectance by absorbing, by destructively interfering, or by polarizing the light incident from the outside. The anti-reflective layer may replace a function of the optical member LM.

Each of the first adhesive member AM1, the second adhesive member AM2, and the third adhesive member AM3 may be an organic adhesive layer such as an Optically Clear Adhesive (OCA) film, an Optically Clear Resin (OCR), or a Pressure Sensitive Adhesive (PSA) film. The organic adhesive layer may include an adhesive material, such as a polyurethane, polyacrylic, polyester, polyepoxy, and polyvinyl acetate.

In other embodiments, the display device DD may further include a frame structure for supporting the functional layers to maintain a state shown in FIGS. 1A to 1C. The frame structure may include an articulated structure or a hinge structure.

Figure 3A:
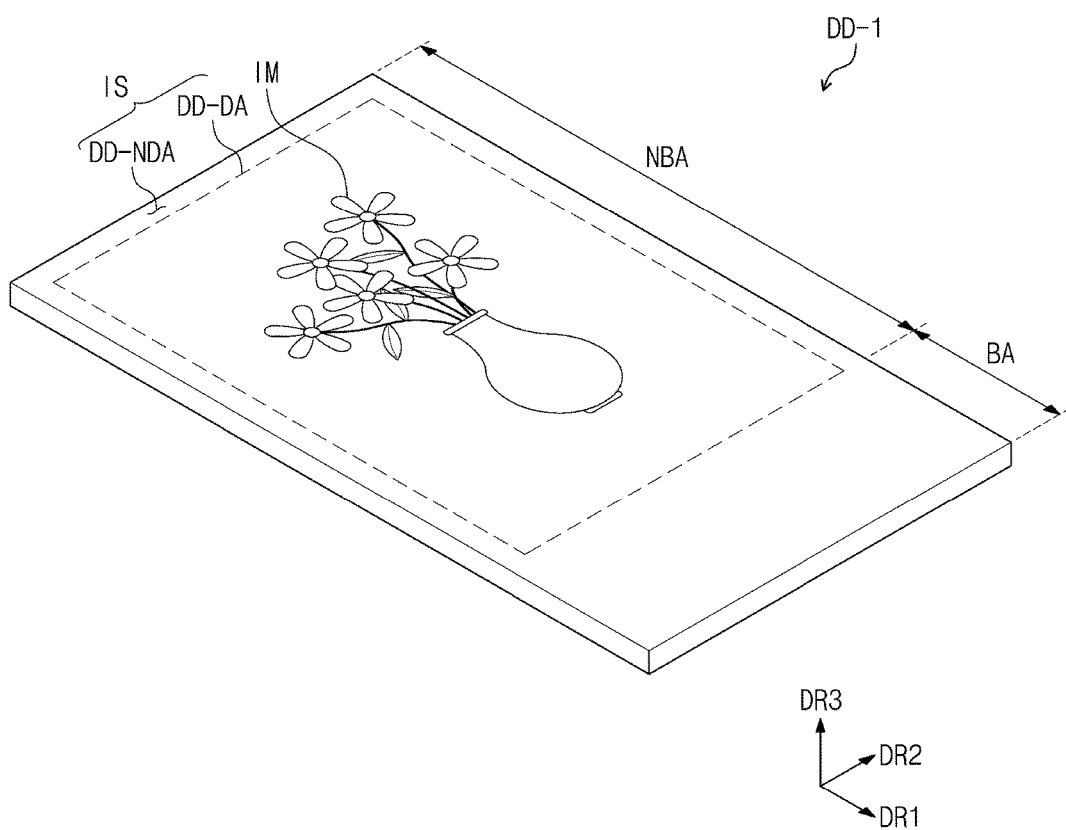
FIGS. 3A and 3B are perspective views of a display device according to an embodiment of the inventive concept.
Figure 3B:
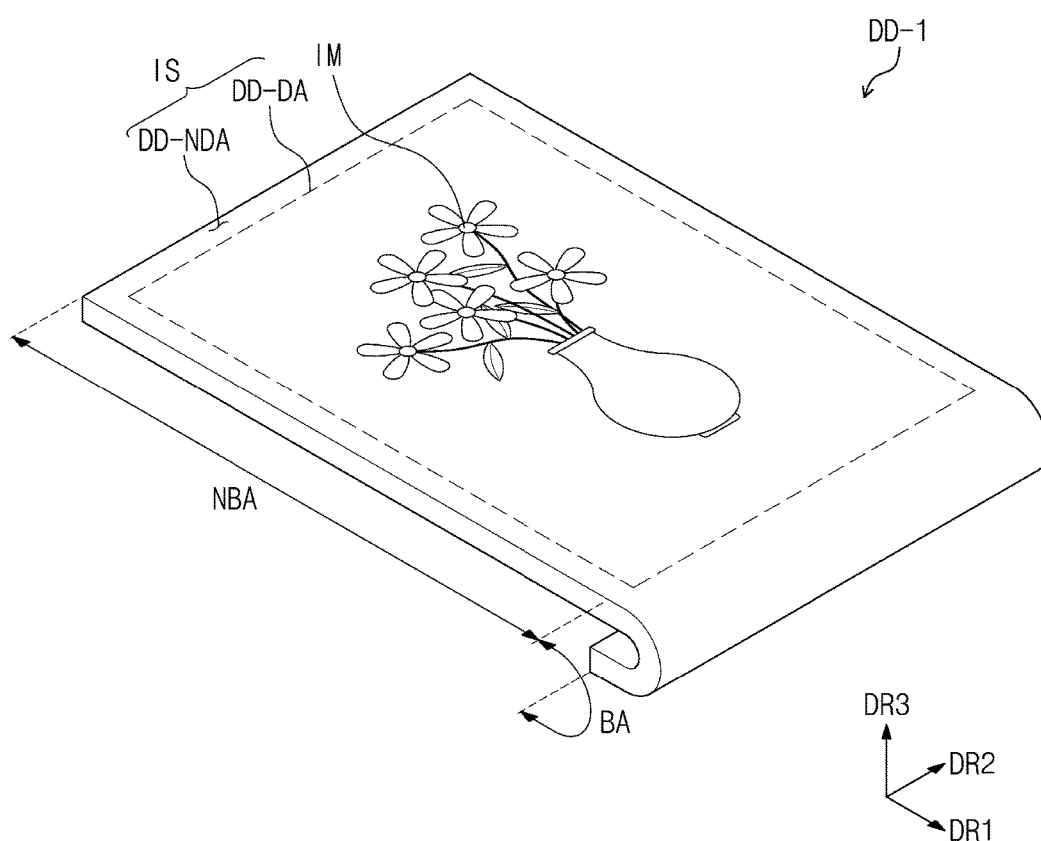

FIGS. 3A and 3B are perspective views of a display device DD-1 according to an embodiment of the inventive concept. FIG. 3A shows the display device DD-1 in an unfolded state, and FIG. 3B shows the display device DD-1 in a bent state.

The display device DD-1 may include one bending area BA and one non-bending area NBA. The non-display area DD-NDA of the display device DD-1 may be bended. However, according to an embodiment of the inventive concept, the bending area of the display device DD-1 may be changed.

Unlike the display device DD shown in FIGS. 1A to 1C, the display device DD-1 of the present embodiment may be fixed in one form for operation. As shown in FIG. 3B, the display device DD-1 may operate in a bended state. The display device DD-1 may be fixed at a frame in a bended state, and the frame may be bonded to the housing of an electronic device.

The display device DD-1 may have the same sectional structure as that shown in FIG. 2. However, the non-bending area NBA and the bending area BA may have a different layer-stacked structure. The non-bending area NBA may have the same sectional structure as that shown in FIG. 2, and the bending area BA may have a different sectional structure than that shown in FIG. 2. The optical member LM and the window WM may be omitted from the bending area BA. That is, the optical member LM and the window WM might be located in only the non-bending area NBA. The second adhesive member AM2 and the third adhesive member AM3 may also be omitted from the bending area BA.

Figure 4:
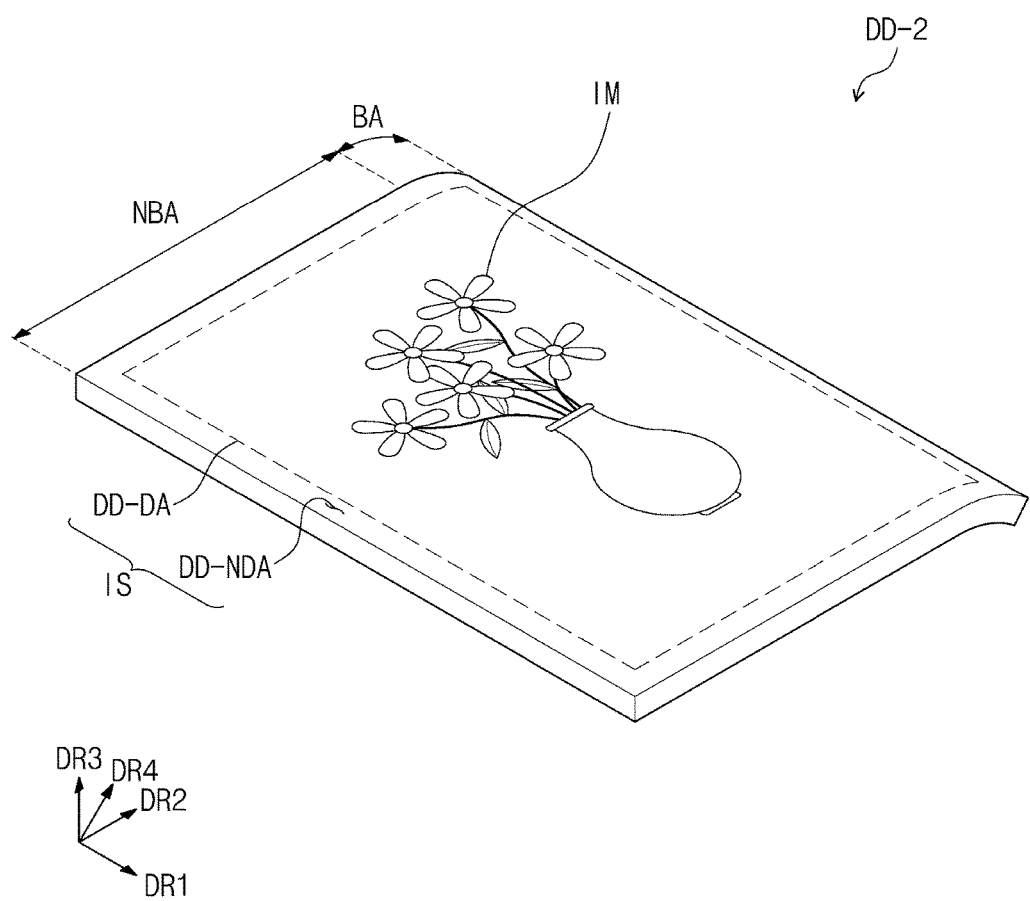
FIG. 4 is a perspective view of a display device according to an embodiment of the inventive concept.

FIG. 4 is a perspective view of a display device DD-2 according to an embodiment of the inventive concept.

The display device DD-2 includes a non-bending area (or a flat area) NBA where a main image is displayed as the front surface, and includes a bending area (or a side area) BA where a sub image is displayed as a side surface. For example, the sub image may include an icon for providing information. According to the present embodiment, the terms "non-bending area NBA" and "bending area BA" define the display device DD-2 by using a plurality of divided areas.

According to the present embodiment, the display device DD-2 including one bending area BA bent from one side of the non-bending area NBA is illustrated as an example. According to an embodiment of the inventive concept, the display device DD-2 may include two bending areas bent at respective sides of the non-bending area NBA.

The bending area BA bent from the non-bending area NBA displays a sub image in a fourth direction DR4 that intersects the first direction DR1, the second direction DR2, and the third direction DR3. However, the directions that the first to fourth directions DR1 to DR4 indicate may be converted to other directions as a relative concept.

Figure 5A:
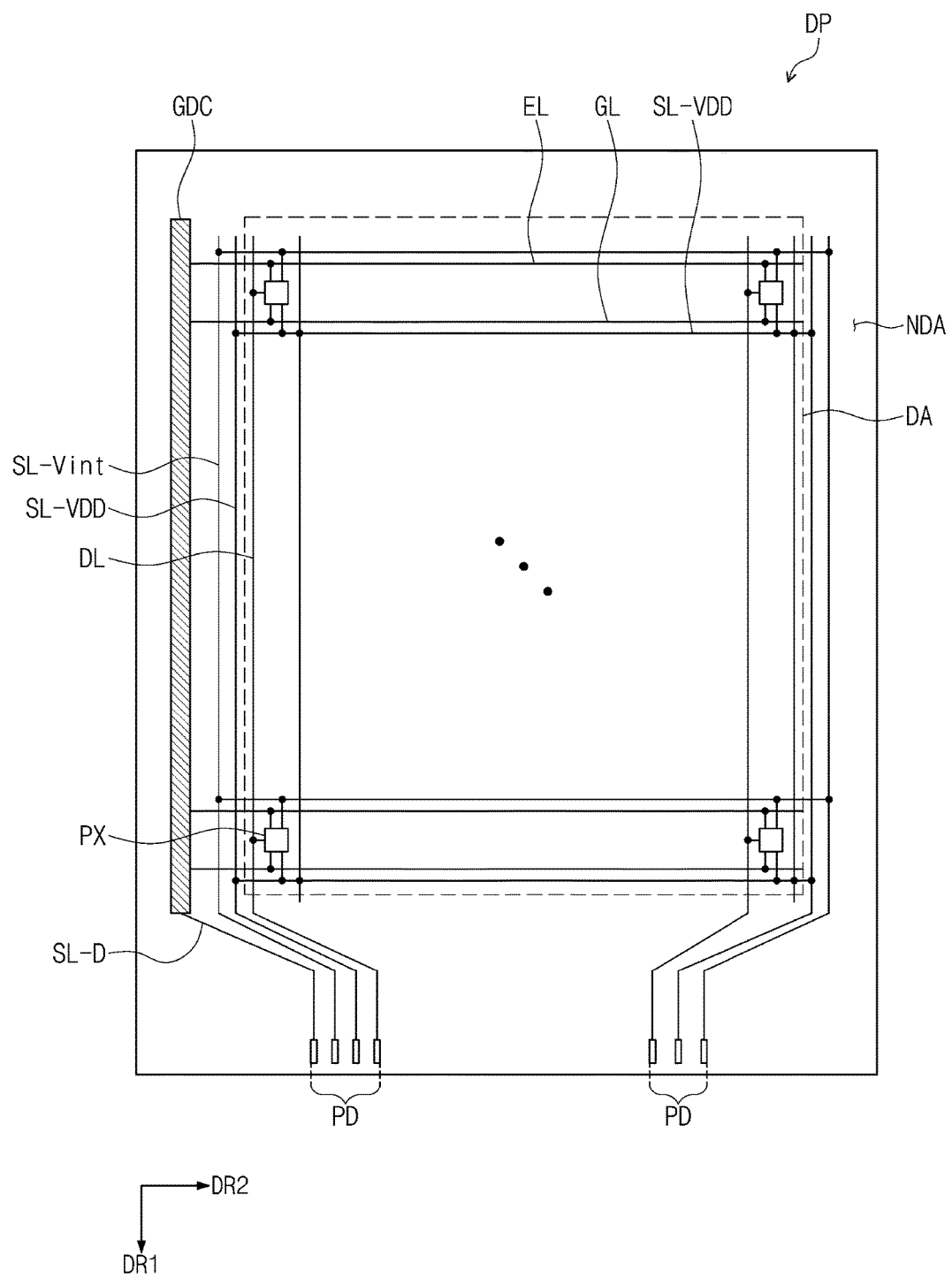
FIG. 5A is a plan view of an organic light emitting display panel according to an embodiment of the inventive concept.
Figure 5B:
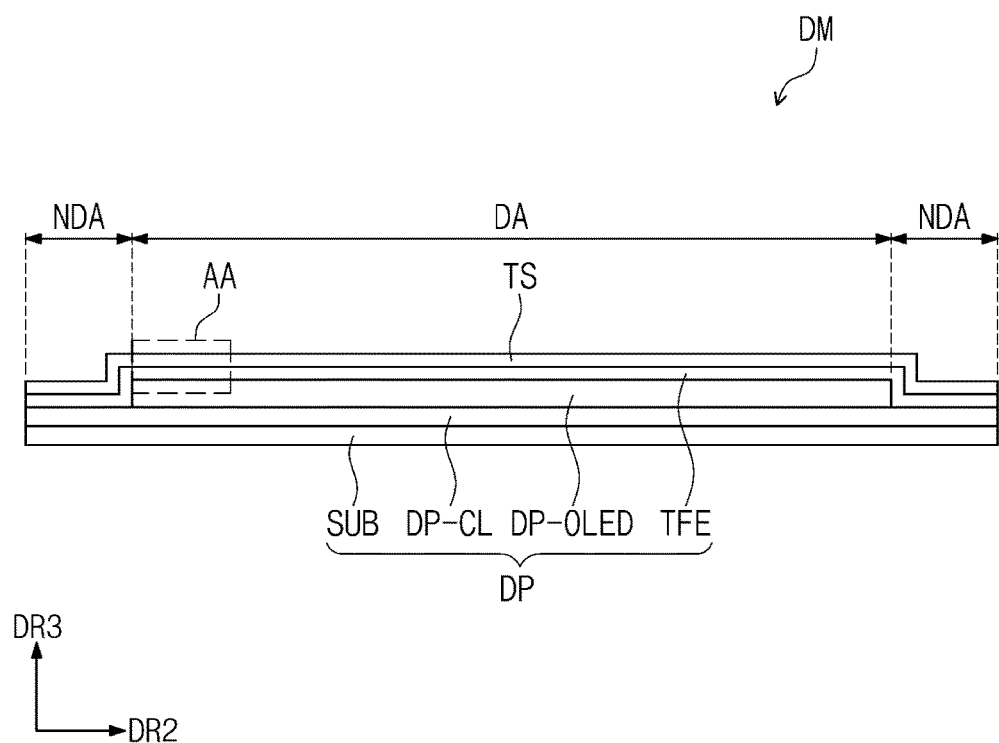
FIG. 5B is a sectional view of a display module according to an embodiment of the inventive concept.

FIG. 5A is a plan view of an organic light emitting display panel DP according to an embodiment of the inventive concept, and FIG. 5B is a sectional view of a display module DM according to an embodiment of the inventive concept.

As shown in FIG. 5A, the organic light emitting display panel DP includes a display area DA and a non-display area NDA on a plane. The display area DA and the non-display area NDA of the organic light emitting display panel DP correspond to the display area DD-DA and the non-display area DD-NDA of the display device DD (see FIG. 1A), respectively. The display area DA and the non-display area NDA of the organic light emitting display panel DP might not be identical to the display area DD-DA (see FIG. 1A) and the non-display area DD-NDA (see FIG. 1A) of the display device DD (see FIG. 1A), and may vary according to a structure/design of the organic light emitting display panel DP.

The organic light emitting display panel DP includes a plurality of pixels PX. An area where the plurality of pixels PX are located may be defined as the display area DA. In this embodiment, the non-display area NDA may be defined along the outline/perimeter of the display area DA.

The organic light emitting display panel DP includes gate lines GL, data lines DL, light emitting lines EL, a control signal line SL-D, an initialization voltage line SL-Vint, a voltage line SL-VDD, and a pad part PD.

The gate lines GL are respectively connected to corresponding pixels PX among the plurality of pixels PX, and the data lines DL are respectively connected to corresponding pixels PX among the plurality of pixels PX. Each of the light emitting lines EL may be arranged parallel to a corresponding gate line GL among the gate lines GL. The control signal line SL-D may provide control signals to the gate driving circuit GDC. The initialization voltage line SL-Vint may provide initialization voltage Vint to the plurality of pixels PX. The voltage line SL-VDD may be connected to the plurality of pixels PX, and may provide a first voltage ELVDD to the plurality of pixels PX. The voltage line SL-VDD may include a plurality of lines extending in the first direction DR1 and a plurality of lines extending in the second direction DR2.

The gate driving circuit GDC where the gate lines GL and the light emitting lines EL are connected may be located at one side of the non-display area NDA. Some of the gate lines GL, the data lines DL, the light emitting lines EL, the control signal line SL-D, the initialization voltage line SL-Vint, and the voltage line SL-VDD are located at the same layer and some of them are located at another layer.

The pad part PD may be connected to the ends of the data lines DL, the control signal line SL-D, the initialization voltage line SL-Vint, and the voltage line SL-VDD.

As shown in FIG. 5B, the organic light emitting display panel DP includes a base layer SUB, a circuit layer DP-CL located on the base layer SUB, a light emitting device layer DP-OLED, and a thin film sealing layer TFE.

The base layer SUB may include at least one plastic film. The base layer SUB may include a plastic substrate, a glass substrate, a metal substrate, or an organic/inorganic composite material substrate as a flexible substrate. The plastic substrate may include at least one of acrylic resin, methacrylic resin, polyisoprene, vinyl resin, epoxy resin, urethane resin, cellulose resin, siloxane-based resin, polyimide-based resin, polyamide-based resin, and perylene resin.

The circuit layer DP-CL may include a plurality of insulation layers, a plurality of conductive layers, and a semiconductor layer. The plurality of conductive layers of the circuit layer DP-CL may constitute signal lines or a control circuit of a pixel.

The light emitting device layer DP-OLED includes organic light emitting diodes.

The thin film sealing layer TFE seals the light emitting device layer DP-OLED. The thin film sealing layer TFE includes a plurality of inorganic layers and at least one organic layer therebetween. The inorganic layers protect the light emitting device layer DP-OLED from moisture/oxygen, and the organic layer protects the light emitting device layer DP-OLED from a foreign material, such as dust particles. In the inventive concept, the touch detection unit TS provides substantially uniform touch sensitivity by adjusting the thickness of an organic layer. Detailed description for this will be made later.

The touch detection unit TS is located on the thin film sealing layer TFE. The touch detection unit TS includes touch sensors and touch signal lines. The touch sensors and the touch signal lines may have a single-layer or multi-layer structure.

The touch sensors and the touch signal lines may include indium tin oxide (ITO), indium zinc oxide (IZO), zinc oxide (ZnO), indium tin zinc oxide (ITZO), PEDOT, metal nano wire, and graphene. The touch sensors and the touch signal lines may include a metal layer, for example, molybdenum, silver, titanium, copper, aluminum, or alloys thereof. The touch sensors and the touch signal lines may have the same or different layer structure. Specific contents on the touch detection unit TS will be described later.

Figure 6A:
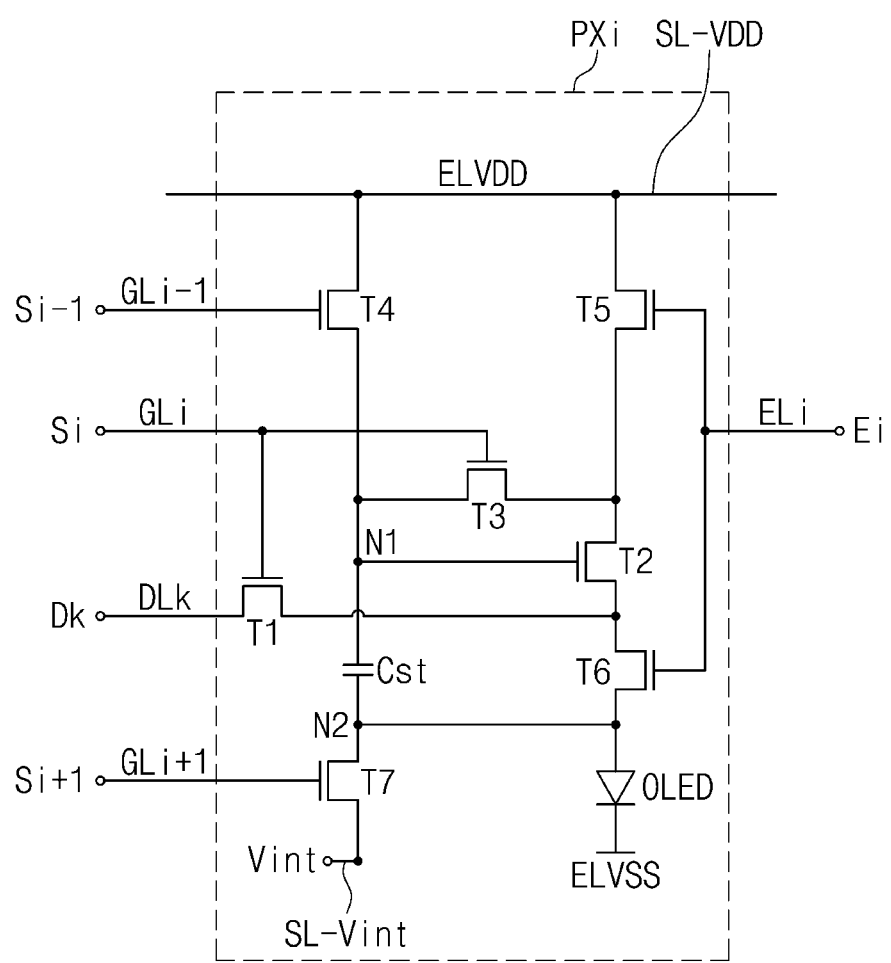
FIG. 6A is an equivalent circuit diagram of a pixel according to an embodiment of the inventive concept.

FIG. 6A is an equivalent circuit diagram of a pixel PX according to an embodiment of the inventive concept.

FIG. 6A shows an example of an ith pixel PXi connected to a kth data line DLk among the plurality of data lines DL (see FIG. 5A).

The ith pixel PXi includes an organic light emitting diode OLED, and includes a pixel driving circuit for controlling the organic light emitting diode OLED. The pixel driving circuit may include seven thin film transistors T1 to T7 and one capacitor Cst.

A driving transistor/second transistor T2 controls a driving current supplied to the organic light emitting diode OLED. The output electrode of the second transistor T2 is electrically connected to the organic light emitting diode OLED. The output electrode of the second transistor T2 may directly contact the anode of the organic light emitting diode OLED, or may be connected to it through another transistor (for example, the sixth transistor T6 in the present embodiment).

Control electrodes of control transistors may receive control signals. A control signal applied to the ith pixel PXi may include the i−1th gate signal Si-1, the ith gate signal Si, the i+1th gate signal Si+1, a data signal DK, and the ith light emitting control signal Ei. According to an embodiment of the inventive concept, the control transistors may include the first transistor T1 and the third to seventh transistors T3 to T7.

The first transistor T1 includes an input electrode connected to the kth data line DLk, a control electrode connected to the ith gate line GLi, and an output electrode connected to the output electrode of the second transistor T2. The first transistor T1 is turned on by the gate signal Si (hereinafter referred to as the ith gate signal) applied to the ith gate line GLi, and provides a data signal Dk applied to the kth data line DLk to the capacitor Cst.

Figure 6B:
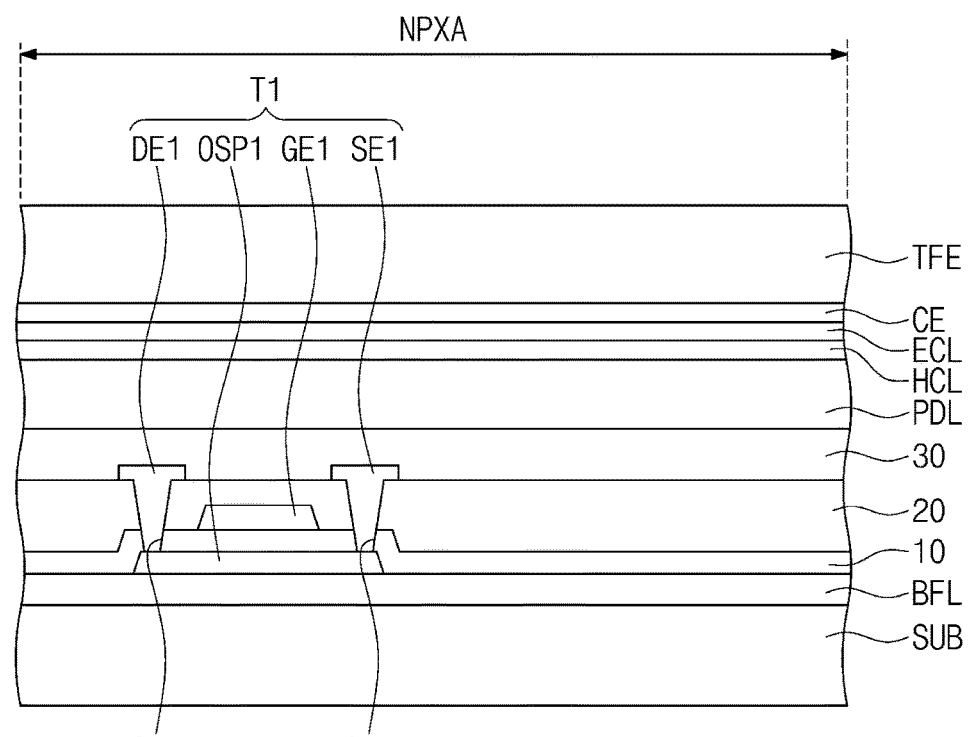
FIG. 6B is a sectional view of a portion of an organic light emitting display panel according to an embodiment of the inventive concept.
Figure 6C:
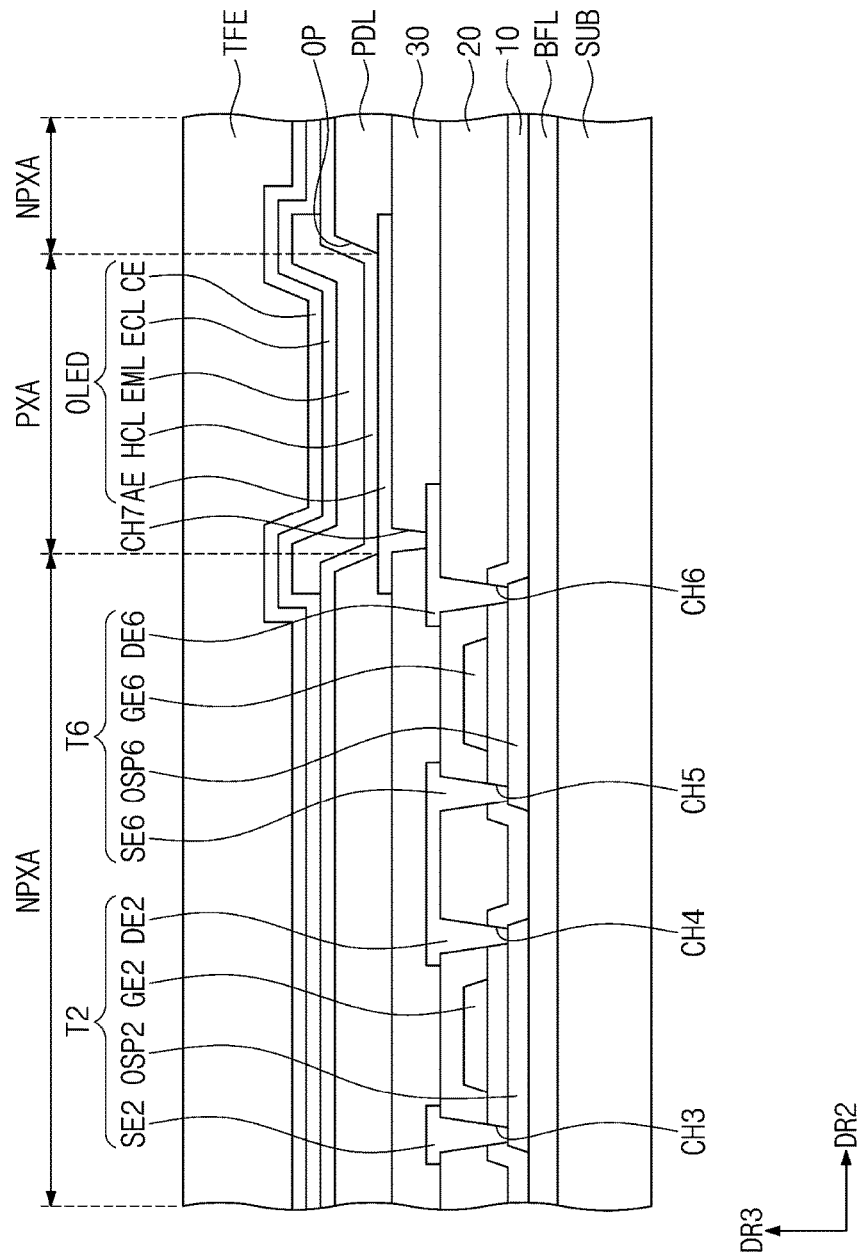
FIG. 6C is a sectional view of a portion of an organic light emitting display panel according to an embodiment of the inventive concept.

FIG. 6B is a sectional view of a portion of an organic light emitting display panel according to an embodiment of the inventive concept. FIG. 6C is a sectional view of a portion of an organic light emitting display panel according to an embodiment of the inventive concept. In detail, FIG. 6B is a sectional view of a part corresponding to the first transistor T1 of the equivalent circuit shown in FIG. 6A. FIG. 6C is a sectional view of a part corresponding to the second transistor T2, the sixth transistor T6, and the organic light emitting diode OLED of the equivalent circuit shown in FIG. 6A.

Referring to FIGS. 6B and 6C, a buffer layer BFL may be located on the base layer SUB. The buffer layer BFL improves the bonding strength of the base layer SUB and conductive patterns or semiconductor patterns. The buffer layer BFL may include an inorganic layer. In some embodiments, a barrier layer for preventing a foreign material from entering may be further located on an upper surface of the base layer SUB. The buffer layer BFL and the barrier layer may be selectively located or omitted.

A semiconductor pattern OSP1 (hereinafter referred to as a first semiconductor pattern) of the first transistor T1, a semiconductor pattern OSP2 (hereinafter referred to as a second semiconductor pattern) of the second transistor T2, and a semiconductor pattern OSP6 (hereinafter referred to as a sixth semiconductor pattern) of the sixth transistor T6 are located on the buffer layer BFL. The first semiconductor pattern OSP1, the second semiconductor pattern OSP2, and the sixth semiconductor pattern OSP6 may be selected from amorphous silicon, polysilicon, and metal oxide semiconductors.

A first insulation layer 10 may be located on the first semiconductor pattern OSP1, the second semiconductor pattern OSP2, and the sixth semiconductor pattern OSP6. Although it is shown in FIGS. 6B and 6C that the first insulation layer 10 covers the first semiconductor pattern OSP1, the second semiconductor pattern OSP2, and the sixth semiconductor pattern OSP6, in other embodiments the first insulation layer 10 may be provided as a pattern located corresponding to the first semiconductor pattern OSP1, the second semiconductor pattern OSP2, and the sixth semiconductor pattern OSP6.

The first insulation layer 10 may include a plurality of inorganic thin layers. The plurality of inorganic thin layers may include a silicon nitride layer, a silicon oxynitride layer, and a silicon oxide layer.

A control electrode GE1 (hereinafter referred to as a first control electrode) of the first transistor T1, a control electrode GE2 (hereinafter referred to as a second control electrode) of the second transistor T2, and a control electrode GE6 (hereinafter referred to as a sixth control electrode) of the sixth transistor T6 are located on the first insulation layer 10. The first control electrode GE1, the second control electrode GE2, and the sixth control electrode GE6 may be fabricated according to the same photolithography process as the gate lines GL (see FIG. 5A).

A second insulation layer 20 for covering the first control electrode GE1, the second control electrode GE2, and the sixth control electrode GE6 may be located on the first insulation layer 10. The second insulation layer 20 may provide a flat, planar upper surface. The second insulation layer 20 may include an organic material and/or an inorganic material.

An input electrode SE1 (hereinafter referred to as a first input electrode) and an output electrode DE1 (hereinafter referred to as a first output electrode) of the first transistor T1, an input electrode SE2 (hereinafter referred to as a second input electrode) and an output electrode DE2 (hereinafter referred to as a second output electrode) of the second transistor T2, and an input electrode SE6 (hereinafter referred to as a sixth input electrode) and an output electrode DE6 (hereinafter referred to as a sixth output electrode) of the sixth transistor T6 are located on the second insulation layer 20.

Each of the first input electrode SE1 and the first output electrode DE1 is connected to the first semiconductor pattern OSP1 through a respective one of a first penetration hole CH1 and a second penetration hole CH2 penetrating the first insulation layer 10 and the second insulation layer 20. Each of the second input electrode SE2 and the second output electrode DE2 is connected to the second semiconductor pattern OSP2 through a respective one of a third penetration hole CH3 and a fourth penetration hole CH4 penetrating the first insulation layer 10 and the second insulation layer 20. Each of the sixth input electrode SE6 and the sixth output electrode DE6 is connected to the sixth semiconductor pattern OSP6 through a respective one of a fifth penetration hole CH5 and a sixth penetration hole CH6 penetrating the first insulation layer 10 and the second insulation layer 20. On the other hand, according to another embodiment of the inventive concept, some of the first transistor T1, the second transistor T2, and the sixth transistor T6 may be modified as a bottom gate structure and implemented.

A third insulation layer 30 for covering the first input electrode SE1, the second input electrode SE2, the sixth input electrode SE6, the first output electrode DE1, the second output electrode DE2, and the sixth output electrode DE6 is located on the second insulation layer 20. The third insulation layer 30 may include an organic layer and/or an inorganic layer. Especially, the third insulation layer 30 may include an organic material for providing a flat surface.

One of the first insulation layer 10, the second insulation layer 20, and the third insulation layer 30 may be omitted according to a circuit structure of a pixel. Each of the second insulation layer 20 and the third insulation layer 30 may be defined as an interlayer insulation layer. The interlayer insulation layer is located between a conductive pattern at a lower part and a conductive pattern at an upper part on the basis of the interlayer insulation layer to insulate the conductive patterns.

A pixel definition layer PDL and an organic light emitting diode OLED are located on the third insulation layer 30. An anode AE is located on the third insulation layer 30. The anode AE is connected to the sixth output electrode DE6 through a seventh penetration hole CH7 penetrating the third insulation layer 30. An opening part OP is defined in the pixel definition layer PDL. The opening part OP of the pixel definition layer PDL exposes at least a part of the anode AE.

The pixel PX may be located in a pixel area on a plane. The pixel area may include a light emitting area PXA, and may include a non-light emitting area NPXA adjacent to the light emitting area PXA. The non-light emitting area NPXA may surround the light emitting area PXA. According to the present embodiment, the light emitting area PXA is defined corresponding to a partial area of the anode AE exposed by the opening part OP.

A hole control layer HCL may be commonly located in the light emitting area PXA and the non-light emitting area NPXA. In some embodiments, a common layer, such as the hole control layer HCL, may be commonly formed in the plurality of pixels PX (see FIG. 5A).

An organic light emitting layer EML is located on the hole control layer HCL. The organic light emitting layer EML may be located in an area corresponding to the opening part OP. That is, the organic light emitting layer EML may be divided and formed at each of the plurality of pixels PX. Although the patterned organic light emitting layer EML is shown according to this embodiment, the organic light emitting layer EML may be commonly located at the plurality of pixels PX. At this point, the organic light emitting layer EML may generate white light. Additionally, the organic light emitting layer EML may have a multilayer structure.

An electron control layer ECL is located on the organic light emitting layer EML. In some embodiments, the electron control layer ECL may be commonly formed at the plurality of pixels PX (see FIG. 5A).

A cathode CE is located on the electron control layer ECL. The cathode CE is commonly located at the plurality of pixels PX.

The thin film sealing layer TFE is located on the cathode CE. The thin film sealing layer TFE is commonly located at the plurality of pixels PX. The thin film sealing layer TFE includes at least one inorganic layer and at least one organic layer. The thin film sealing layer TFE may include a plurality of inorganic layers and a plurality of organic layers, which are stacked alternately.

According to the present embodiment, the thin film sealing layer TFE directly covers the cathode CE. According to an embodiment of the inventive concept, a capping layer for covering the cathode CE may be further located between the thin film sealing layer TFE and the cathode CE. At this point, the thin film sealing layer TFE may directly cover the capping layer.

Figure 7A:
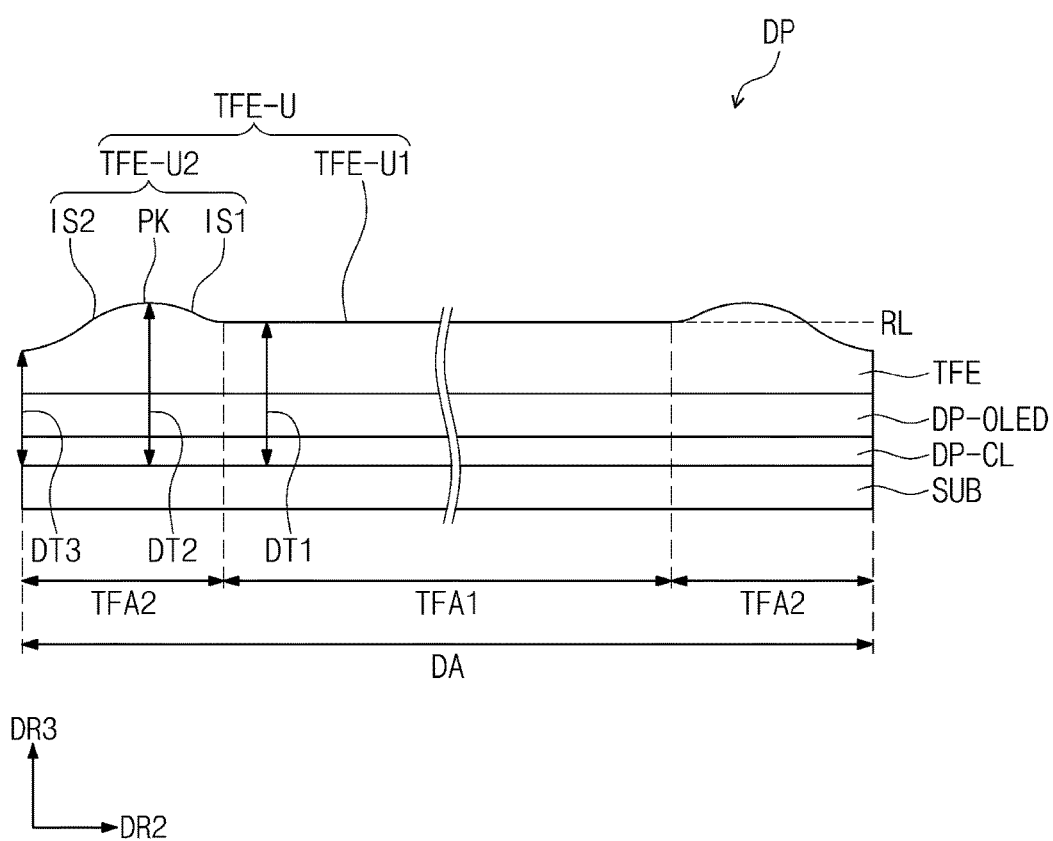
FIG. 7A is a sectional view of a portion of an organic light emitting display panel according to an embodiment of the inventive concept.

FIG. 7A is a partial sectional view of an organic light emitting display panel DP according to an embodiment of the inventive concept. In more detail, FIG. 7A is an enlarged sectional view of the display area DA of the organic light emitting display panel DP of FIG. 5B.

Referring to FIG. 7A, the thin film sealing layer TFE may be divided into a first thin film sealing area TFA1 and a second thin film sealing area TFA2.

An upper surface TFE-U of the thin film sealing layer TFE and facing the touch detection unit TS (see FIG. 5B) may include a first upper surface TFE-U1 located in the first thin film sealing area TFA1 and a second upper surface TFE-U2 located in the second thin film sealing area TFA2.

The first upper surface TFE-U1 may be parallel to the base layer SUB. For example, the first upper surface TFE-U1 may be parallel to the upper surface of the base layer SUB. If the organic light emitting display panel DP has a flat form, both the first upper surface TFE-U1 and the base layer SUB may have a flat form. Additionally, if the organic light emitting display panel DP is bent along a predetermined direction, both the first upper surface TFE-U1 and the base layer SUB may have a form bent along the predetermined direction.

"Parallel," as described in this specification, means not only "parallel" of the dictionary meaning (that is, no matter how long two lines extend, they do not meet each other). For example, the first upper surface TFE-U1 may have an uneven upper surface. In more detail, a reference surface that is parallel to the base layer SUB in the dictionary meaning is defined on a section. The first upper surface TFE-U1 may vibrate (e.g., have waves/ripples) with respect to the third direction DR3 on the basis of the reference surface, which may extend along the reference surface. A difference between a distance between the first upper surface TFE-U1 and the base layer SUB, and a distance between the reference surface and the base layer SUB, may be a 0 to some error range. The error range may be several hundred nanometers or less.

The second upper surface TFE-U2 may convexly protrude in a direction that is progressively away from the base layer SUB, for example, the third direction DR3. In more detail, the second upper surface TFE-U2 may protrude from the reference surface RL, which extends from the first upper surface TFE-U1, in a direction (for example, the third direction DR3) that is progressively away from the base layer SUB.

A distance between the first upper surface TFE-U1 and the base layer SUB may be a first distance DT1. For example, because the first upper surface TFE-U1 is parallel to the base layer SUB, a distance between each point on the first upper surface TFE-U1 and the base layer SUB may be substantially equal within an error range. For example, the predetermined error range may be several hundred nanometers or less. In more detail, the error range may be below 500 nanometers.

"Distance," as used in this specification, means a distance measured in a direction parallel to a thickness direction of the organic light emitting display panel DP. For example, when the organic light emitting display panel DP is flat, "distance" may be a distance parallel to the third direction DR3. Additionally, when the organic light emitting display panel DP is curved, "distance" may be a distance measured along the normal direction that is perpendicular to the tangent of the curved surface at a measurement point.

A distance between the second upper surface TFE-U2 and the base layer SUB may have various distances within a range of a second distance DT2, which is greater than the first distance DT1, to a third distance DT3, which is less than the first distance DT1. That is, a maximum distance between the second upper surface TFE-U2 and the base layer SUB is the second distance DT2, and a minimum distance between the second upper surface TFE-U2 and the base layer SUB is the third distance DT3.

The second upper surface TFE-U2 may include a peak PK, a first inclined surface IS1, and a second inclined surface IS2. The peak PK may be defined as an area in the second upper surface TFE-U2 that is spaced the second distance DT2 from the base layer SUB. That is, the peak PK may be an area having the furthest distance (e.g., second distance DT2) from the base layer SUB. The first inclined surface IS1 may extend in a direction that is progressively away from the base layer SUB, and may connect the first upper surface TFE-U1 and the peak PK. The second inclined surface IS2 may extend from the peak PK to the base layer SUB.

In this embodiment, the terms "the first thin film sealing area TFA1 and the second thin film sealing area TFA2" define the thin film sealing layer TFE with a plurality of areas separated by the form of an upper surface thereof. The first thin film sealing area TFA1 and the second thin film sealing area TFA2 may be defined on a section in addition to a plane defined by the first direction DR1 and the second direction DR2. That is, the first thin film sealing area TFA1 and the second thin film sealing area TFA2 may be areas defined on the three dimensions.

Figure 7B:
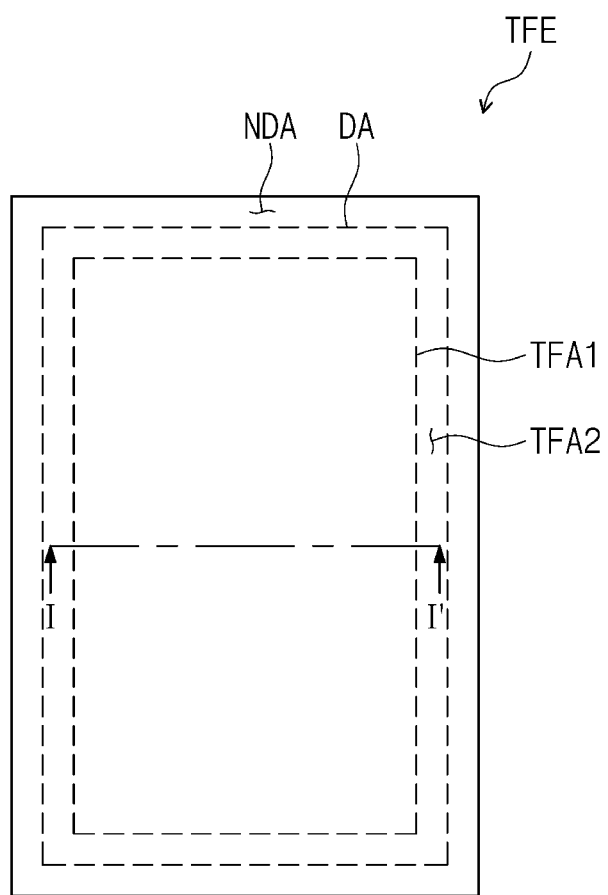
FIG. 7B is a schematic plan view of a thin film sealing layer according to an embodiment of the inventive concept.
Figure 7B:
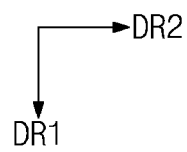

FIG. 7B is a schematic plan view of a thin film sealing layer TFE according to an embodiment of the inventive concept. In more detail, FIG. 7B shows a relationship of a first thin film sealing area TFA1, a second thin film sealing area TFA2, a display area DA, and a non-display area NDA when seen from a thickness direction.

The first thin film sealing area TFA1 and the second thin film sealing area TFA2 may overlap the display area DA on a plane. On the plane, the first thin film sealing area TFA1 may be surrounded by the second thin film sealing area TFA2. Accordingly, the second thin film sealing area TFA2 may be located between the non-display area NDA and the first thin film sealing area TFA1.

Figure 7C:
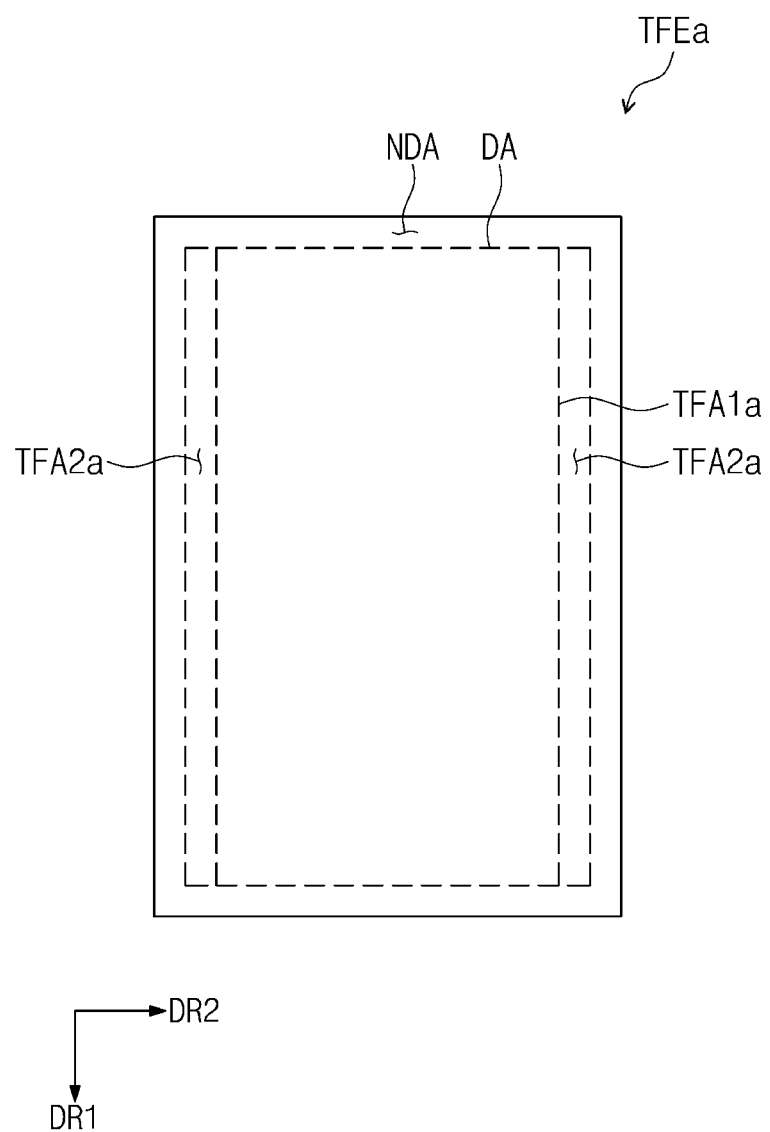
FIG. 7C is a schematic plan view of a thin film sealing layer according to an embodiment of the inventive concept.

FIG. 7C is a schematic plan view of a thin film sealing layer TFEa according to an embodiment of the inventive concept. When FIG. 7C is compared with FIG. 7B, there is a difference in the positional relationship of the first thin film sealing area TFA1 and the second thin film sealing area TFA2.

Referring to FIG. 7C, the second thin film sealing area TFA2a may be located at both sides of the first thin film sealing area TFA1a. For example, as shown in FIG. 7C, a first part of the second thin film sealing area TFA2a, the first thin film sealing area TFA1a, and a second part of the second thin film sealing area TFA2a may be sequentially arranged along the second direction DR2.

The arrangement relationship of the first thin film sealing area TFA1a and the second thin film sealing area TFA2a is not limited to the embodiments shown in FIGS. 7B and 7C as described above. For example, the second thin film sealing area TFA2a may be located at only one side of the first thin film sealing area TFA1a, or may be located at three sides of the first thin film sealing area TFA1a.

Figure 8A:
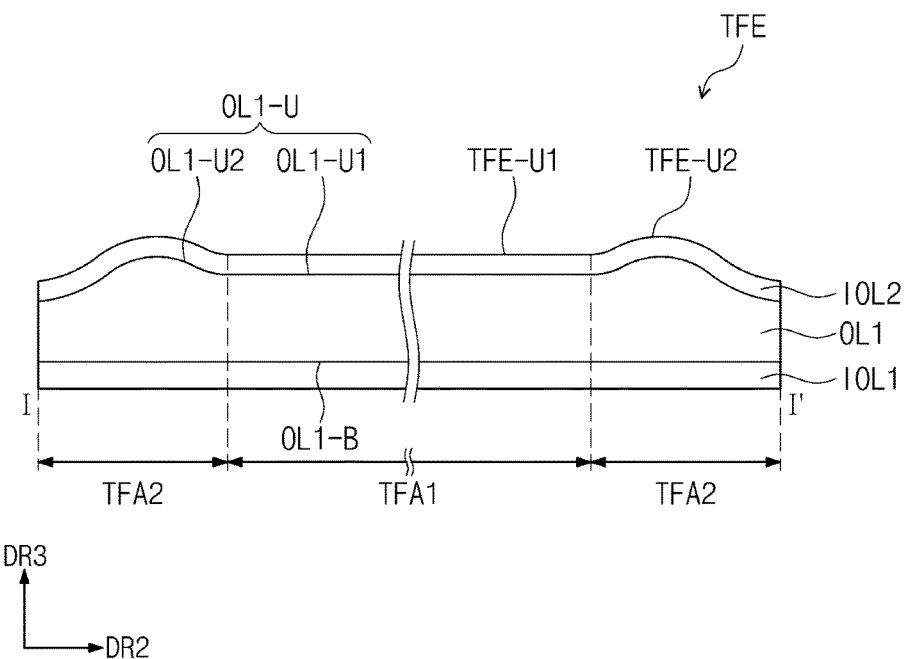
FIG. 8A is a sectional view taken along the line I-I' of FIG. 7B.

FIG. 8A is a sectional view taken along the line I-I' of FIG. 7B.

Referring to FIG. 8A, the thin film sealing layer TFE may include a first inorganic layer IOL1, a second inorganic layer IOL2, and a first organic layer OL1.

The first inorganic layer IOL1 may be located on the cathode CE (see FIG. 6C). The first organic layer OL1 may be located on the first inorganic layer IOL1. The second inorganic layer IOL2 may be located on the first organic layer OL1.

The first inorganic layer IOL1 and the second inorganic layer IOL2 may be a single layer including one material or a multilayer including each different material. The first organic layer OL1 may include a polymer containing a monomer. The first organic layer OL1 may be formed using an inkjet printing method, or may be formed by coating a composition containing an acrylic monomer. The form of the second upper surface TFE-U2 of the thin film sealing layer TFE may be provided by the first organic layer OL1. The first organic layer OL1 may include a lower surface OL1-B and an upper surface OL1-U. The lower surface OL1-B of the first organic layer OL1 is a surface contacting the first inorganic layer IOL1 and the upper surface OL1-U of the first organic layer OL1 is a surface contacting the second inorganic layer IOL2. The lower surface OL1-B of the first organic layer OL1 may have a form corresponding to the form of the first inorganic layer IOL1.

The upper surface OL1-U of the first organic layer OL1 may include a first surface OL1-U1 and a second surface OL1-U2. The first surface OL1-U1 may be located in the first thin film sealing area TFA1 and parallel to the base layer SUB (see FIG. 7A). The second surface OL1-U2 may be located in the second thin film sealing area TFA2, and may protrude in a direction that is progressively away from the base layer SUB (see FIG. 7A). The second surface OL1-U2 may be formed by adjusting an amount of a composition containing a monomer that is printed in the second thin film sealing area TFA2, or by adjusting a printing time.

Figure 8B:
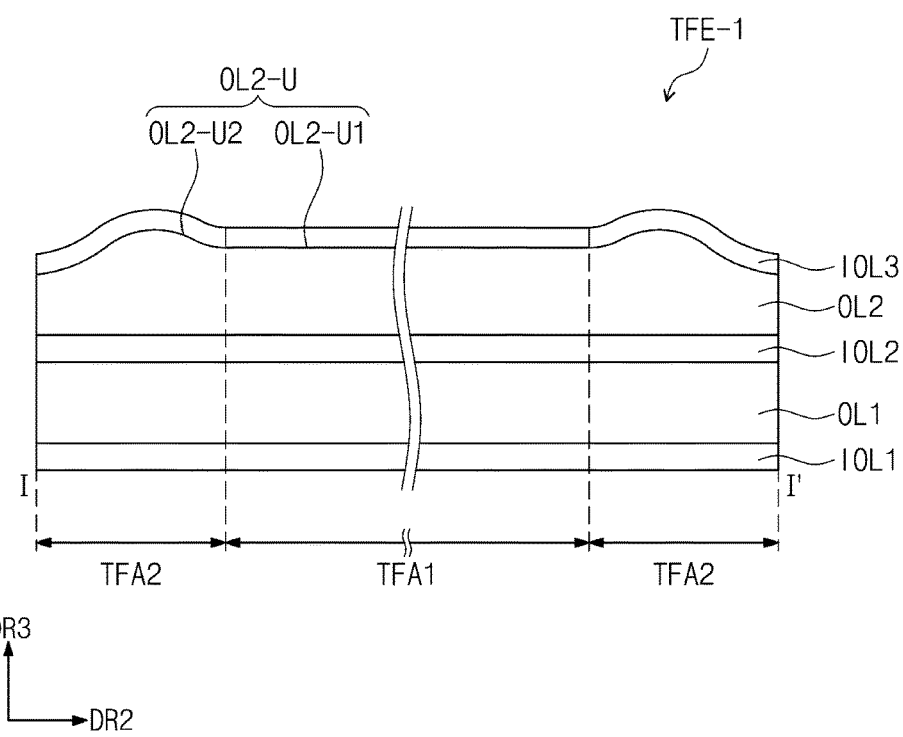
FIG. 8B is a sectional view taken along the line I-I' of FIG. 7B.
Figure 8C:
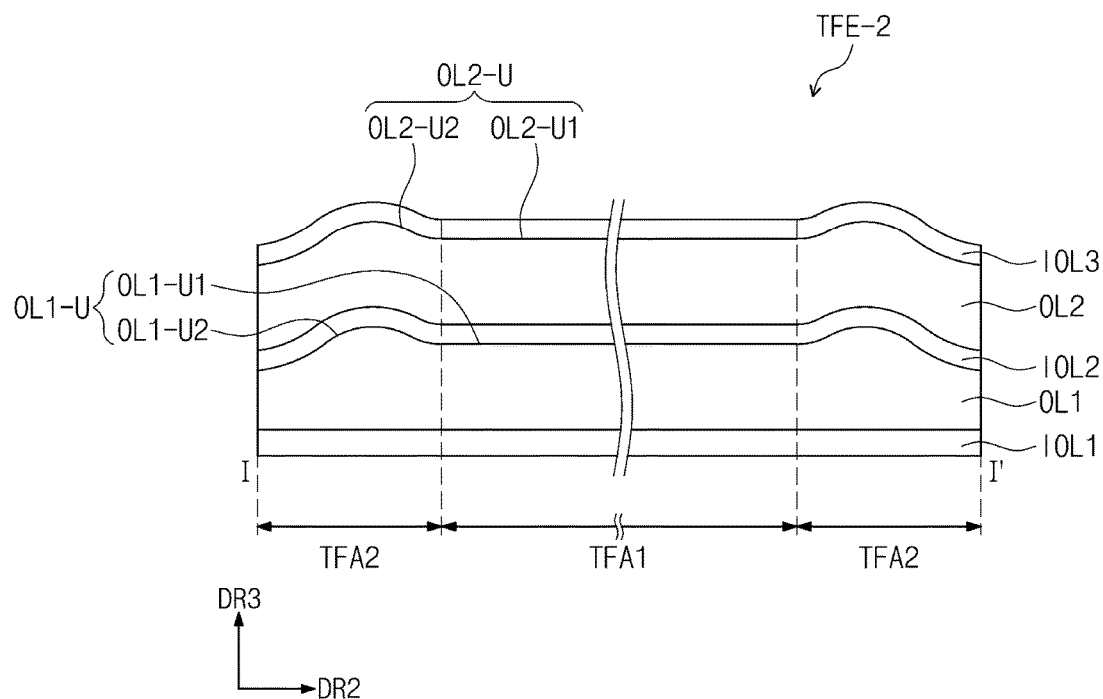
FIG. 8C is a sectional view taken along the line I-I' of FIG. 7B.

FIGS. 8B and 8C are sectional views taken along the line I-I' of FIG. 7B.

Referring to FIGS. 8B and 8C, each of thin film sealing layers TFE-1 and TFE-2 may include a first inorganic layer IOL1, a second inorganic layer IOL2, a third inorganic layer IOL3, a first organic layer OL1, and a second organic layer OL2.

The first inorganic layer IOL1 may be located on the cathode CE (see FIG. 6C). The first organic layer OL1 may be located on the first inorganic layer IOL1. The second inorganic layer IOL2 may be located on the first organic layer OL1. The second organic layer OL2 may be located on the second inorganic layer IOL2. The third inorganic layer IOL3 may be located on the second organic layer OL2.

An upper surface of at least one of the first organic layer OL1 and the second organic layer OL2 may include a first surface located in the first thin film sealing area TFA1 and parallel to the base layer SUB (see FIG. 7A) and a second surface located in the second thin film sealing area TFA2 and protruding in a direction that is progressively away from the base layer SUB (see FIG. 7A).

As shown in FIG. 8B, the second organic layer OL2 of the thin film sealing layer TFE-1 includes an upper surface OL2-U. The upper surface OL2-U may include a first surface OL2-U1 located in the first thin film sealing area TFA1 and parallel to the base layer SUB (see FIG. 7A) and a second surface OL2-U2 located in the second thin film sealing area TFA2 and protruding in a direction that is progressively away from the base layer SUB (see FIG. 7A).

As shown in FIG. 8C, the first organic layer OL1 of the thin film sealing layer TFE-2 includes an upper surface OL1-U. The upper surface OL1-U may include a first surface OL1-U1 located in the first thin film sealing area TFA1 and parallel to the base layer SUB (see FIG. 7A), and a second surface OL1-U2 located in the second thin film sealing area TFA2 and protruding in a direction that is progressively away from the base layer SUB (see FIG. 7A).

The second organic layer OL2 of the thin film sealing layer TFE-2 includes an upper surface OL2-U. The upper surface OL2-U may include a first surface OL2-U1 located in the first thin film sealing area TFA1 and parallel to the base layer SUB (see FIG. 7A) and a second surface OL2-U2 located in the second thin film sealing area TFA2 and protruding in a direction that is progressively away from the base layer SUB (see FIG. 7A).

When a thin film sealing layer includes a plurality of organic layers, a form of an upper surface of the thin film sealing layer may be controlled by adjusting the thickness of one organic layer among the plurality of organic layers or the thicknesses of two or more organic layers among the plurality of organic layers.

Although it is shown in FIGS. 8B and 8C that a thin film sealing layer includes three inorganic layers and two organic layers, the inventive concept is not limited thereto. For example, a thin film sealing layer may include three or more inorganic layers and two or more organic layers, and organic layers and inorganic layers may be located alternately. A thickness of organic layers may be greater than a thickness of inorganic layers on average.

Figure 8D:
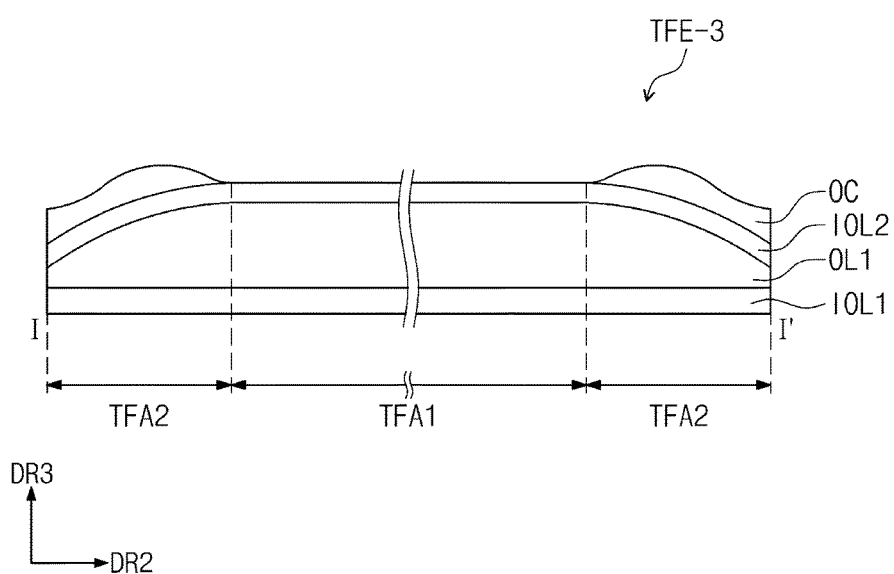
FIG. 8D is a sectional view taken along the line I-I' of FIG. 7B.

FIG. 8D is a sectional view taken along the line I-I' of FIG. 7B.

Referring to FIG. 8D, a thin film sealing layer TFE-3 may include a first inorganic layer IOL1, a second inorganic layer IOL2, a first organic layer OL1, and an organic coating layer OC.

The first inorganic layer IOL1 may be located on the cathode CE (see FIG. 6C). The first organic layer OL1 may be located on the first inorganic layer IOL1. The second inorganic layer IOL2 may be located on the first organic layer OL1. The organic coating layer OC may be located on the second inorganic layer IOL2.

The organic coating layer OC may include an upper surface protruding in a direction that is progressively away from the base layer SUB (see FIG. 7A). Although it is exemplarily shown in this embodiment that the organic coating layer OC is only located on the second thin film sealing area TFA2, the inventive concept is not limited thereto. For example, the organic coating layer OC may be located in the first thin film sealing area TFA1 and the second thin film sealing area TFA2.

Figure 9A:
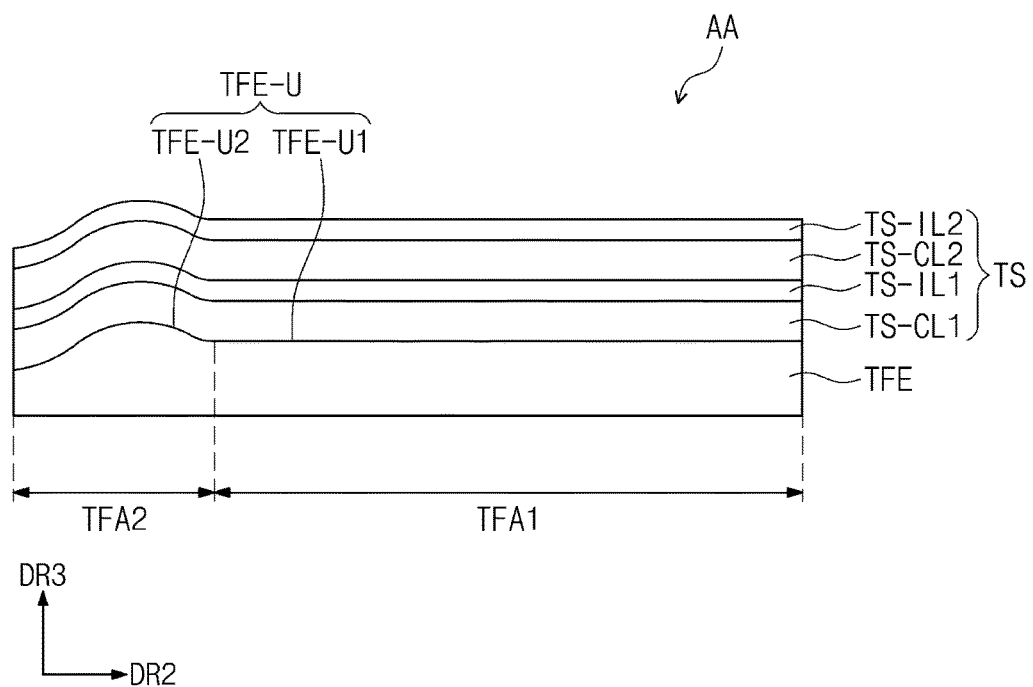
FIG. 9A is a partially enlarged view of an area AA of FIG. 5B.

FIG. 9A is a partially enlarged view of an area AA of FIG. 5B. FIGS. 9B to 9E are plan views of a touch detection unit TS according to an embodiment of the inventive concept.

As shown in FIG. 9A, the touch detection unit TS includes a first conductive layer TS-CL1, a first insulation layer TS-IL1 (hereinafter referred to as a first touch insulation layer), a second conductive layer TS-CL2, and a second insulation layer TS-IL2 (hereinafter referred to as a second touch insulation layer). The first conductive layer TS-CL1 is located on the thin film sealing layer TFE. The touch detection unit TS may have a bending form in a partial area in correspondence to the form of the upper surface TFE-U of the thin film sealing layer TFE.

Each of the first conductive layer TS-CL1 and the second conductive layer TS-CL2 may include a single layer structure or a multilayer structure stacked along the third direction DR3. A conductive layer of the multilayer structure may include at least two of transparent conductive layers and metal layers. A conductive layer of the multilayer structure may include metal layers with different metals. The transparent conductive layer may include indium tin oxide (ITO), indium zinc oxide (IZO), zinc oxide (ZnO), indium tin zinc oxide (ITZO), PEDOT, metal nano wire, or graphene. The metal layer may include silver, titanium, copper, aluminum, or an alloy thereof.

Each of the first conductive layer TS-CL1 and the second conductive layer TS-CL2 includes a plurality of patterns. Hereinafter, the first conductive layer TS-CL1 includes first conductive patterns and the second conductive layer TS-CL2 includes second conductive patterns. Each of the first conductive patterns and the second conductive patterns may include touch electrodes and touch signal lines.

Each of the first touch insulation layer TS-IL1 and the second touch insulation layer TS-IL2 may have a single layer or multilayer structure. Each of the first touch insulation layer TS-IL1 and the second touch insulation layer TS-IL2 may include at least one of an inorganic layer or an organic layer.

It is sufficient that the first touch insulation layer TS-IL1 insulates a first conductive layer TS-CL1 and a second conductive layer TS-CL2, and its form is not limited. According to the forms of first conductive patterns and second conductive patterns, the form of the first touch insulation layer TS-IL1 may be modified. The first touch insulation layer TS-IL1 may cover the thin film sealing layer TFE entirely or may include a plurality of insulation patterns. It is sufficient that the plurality of insulation patterns overlap first connection parts CP1 or second connection parts CP2 described later.

Although a second-layer/multi-layer touch detection unit is shown in the present embodiment, the inventive concept is not limited thereto. A single-layer touch detection unit includes a conductive layer and an insulation layer for covering the conductive layer. The conductive layer includes touch sensors and touch signal lines connected to the touch sensors. The single-layer touch detection unit may obtain coordinate information through a self-cap method.

Figure 9B:
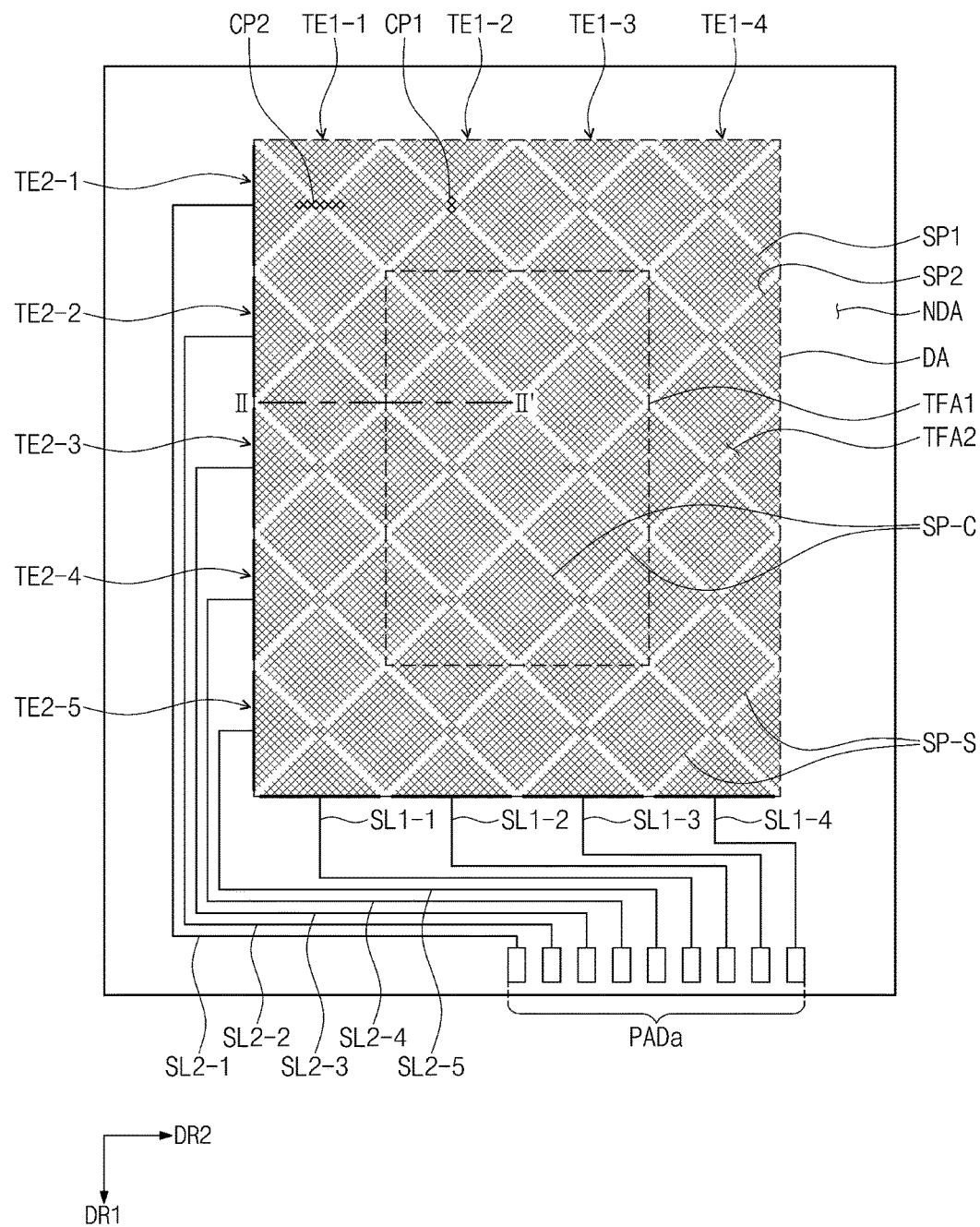
FIG. 9B to 9E are plan views of a touch detection unit according to embodiments of the inventive concept.

As shown in FIG. 9B, the touch detection unit TS may include first touch electrodes TE1-1 to TE1-4, first touch signal lines SL1-1 to SL1-4 connected to the first touch electrodes TE1-1 to TE1-4, second touch electrodes TE2-1 to TE2-5, second touch signal lines SL2-1 to SL2-5 connected to the second touch electrodes TE2-1 to TE2-5, and a pad part PADa connected to the first touch signal lines SL1-1 to SL1-4 and the second touch signal lines SL2-1 to SL2-5.

Each of the first touch electrodes TE1-1 to TE1-4 may extend along the first direction DR1 and may be arranged along the second direction DR2, and each of the second touch electrodes TE2-1 to TE2-5 may extend along the second direction DR2 and may be arranged along the first direction DR1

Although the touch detection unit TS including the four first touch electrodes TE1-1 to TE1-4 and the five second touch electrodes TE2-1 to TE2-5 is shown in the embodiment of FIG. 9B, the inventive concept is not limited thereto. For example, M first touch electrodes (M is an integer of 1 or more) may be arranged sequentially along the second direction DR2, and N second touch electrodes (N is an integer of 1 or more) may be arranged sequentially along the first direction DR1.

In FIG. 9B, the 1st of the first touch electrodes may be the first touch electrode TE1-1, and the Mth first touch electrode may be the first touch electrode TE1-M. Additionally, the 1 st of the second touch electrodes may be the second touch electrode TE2-1, and the Nth second touch electrode may be the second touch electrode TE2-N.

Each of the first touch electrodes TE1-1 to TE1-4 may have a mesh form where a plurality of touch opening parts are defined. Each of the first touch electrodes TE1-1 to TE1-4 includes a plurality of first touch sensor parts SP1 and a plurality of first connection parts CP1. The first touch sensor parts SP1 are arranged along the first direction DR1. Each of the first connection parts CP1 connects adjacent two first touch sensor parts SP1 among the first touch sensor parts SP1. Although not shown in the drawing separately, the first touch signal lines SL1-1 to SL1-4 may also have a mesh form.

The second touch electrodes TE2-1 to TE2-5 insulatingly cross the first touch electrodes TE1-1 to TE1-4. Each of the second touch electrodes TE2-1 to TE2-5 may have a mesh form where a plurality of touch opening parts are defined. Each of the second touch electrodes TE2-1 to TE2-5 includes a plurality of second touch sensor parts SP2 and a plurality of second connection parts CP2. The second touch sensor parts SP2 are arranged along the second direction DR2. Each of the second connection parts CP2 connects a pair of adjacent second touch sensor parts SP2 among the second touch sensor parts SP2. The second touch signal lines SL2-1 to SL2-5 may also have a mesh form.

The first touch electrodes TE1-1 to TE1-4 are electrostatically bonded to the second touch electrodes TE2-1 to TE2-5. As touch detection signals are applied to the first touch electrodes TE1-1 to TE1-4, capacitors are formed between the first touch sensor parts SP1 and the second touch sensor parts SP2.

Parts of the plurality of first touch sensor parts SP1, the plurality of first connection parts CP1 and first touch signal lines SL1-1 to SL1-4, the plurality of second touch sensor parts SP2, as well as parts of the plurality of second connection parts CP2, and second touch signal lines SL2-1 to SL2-5, may be formed by patterning the first conductive layer TS-CL1 shown in FIG. 6A, and the other parts may be formed by patterning the second conductive layer TS-CL2 shown in FIG. 6A.

Each of the first touch sensor parts SP1 and the second touch sensor parts SP2 may be defined as a first sensor part SP-C or a second sensor part SP-S. The terms "the first sensor part SP-C and the second sensor part SP-S" are defined according to positions where touch sensor parts are located.

Touch sensor parts overlapping the first thin film sealing area TFA1 on a plane among the first touch sensor parts SP1 may be defined as the first sensor part SP-C. Touch sensor parts overlapping the second thin film sealing area TFA2 on a plane among the first touch sensor parts SP1 may be defined as the second sensor part SP-S. Additionally, touch sensor parts overlapping the first thin film sealing area TFA1 on a plane among the second touch sensor parts SP2 may be defined as the first sensor part SP-C and touch sensor parts overlapping the second thin film sealing area TFA2 on a plane may be defined as the second sensor part SP-S. That is, the first sensor part SP-C and the second sensor part SP-S are classified according to the position of a touch sensor part.

Referring to FIG. 9B, the first touch sensor parts SP1 constituting two of the first touch electrodes TE1-1 and TE1-4 located at the outermost on a plane (on a periphery) may be defined as the second sensor part SP-S. Additionally, the second touch sensor parts SP2 constituting two of the second touch electrodes TE2-1 and TE2-5 that are located at the outermost on a plane (on a periphery) may be defined as the second sensor part SP-S.

Two first touch electrodes TE1-1 and TE1-4 among the first touch electrodes TE1-1 to TE1-4 may be the closest to the non-display area NDA on a plane.

Additionally, two second touch electrodes TE2-1 and TE2-5 among the second touch electrodes TE2-1 to TE2-5 may be the closest to the non-display area NDA on a plane. The two first touch electrodes TE1-1 and TE1-4 and the two second touch electrodes TE2-1 and TE2-5 may be defined as peripheral touch electrodes.

Some of peripheral touch electrodes may overlap the peak PK (see FIG. 7A) on a plane. For example, as shown in FIG. 7B, when the second thin film sealing area TFA2 surrounds all the sides of the first thin film sealing area TFA1, four peripheral touch electrodes TE1-1, TE1-4, TE2-1, and TE2-5 may overlap the peak PK (see FIG. 7A). Additionally, as shown in FIG. 7C, when the second thin film sealing area TFA2 surrounds only two sides of the first thin film sealing area TFA1, two peripheral touch electrodes TE1-1 and TE1-4 may overlap the peak PK (see FIG. 7A).

To electrically connect conductive patterns located on another layer, a contact hole penetrating the first touch insulation layer TS-IL1 shown in FIG. 9A may be formed. Hereinafter, a touch detection unit TS according to an embodiment of the inventive concept is described with reference to FIGS. 9C to 9E.

Figure 9C:
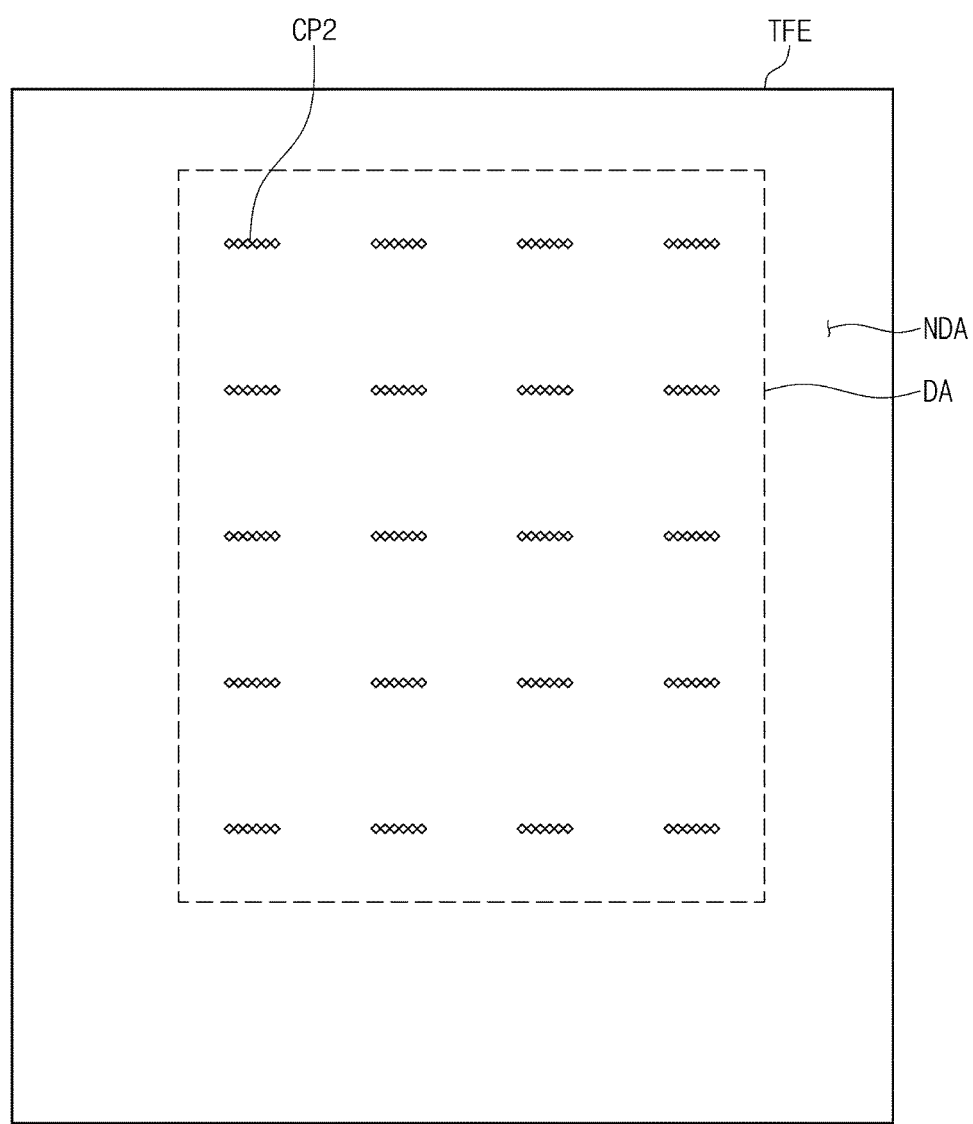

As shown in FIG. 9C, first conductive patterns are located on the thin film sealing layer TFE. The first conductive patterns may include bridge patterns CP2. The bridge patterns CP2 are located on the thin film sealing layer TFE. The bridge patterns CP2 correspond to the second connection parts CP2 shown in FIG. 6B.

Figure 9D:
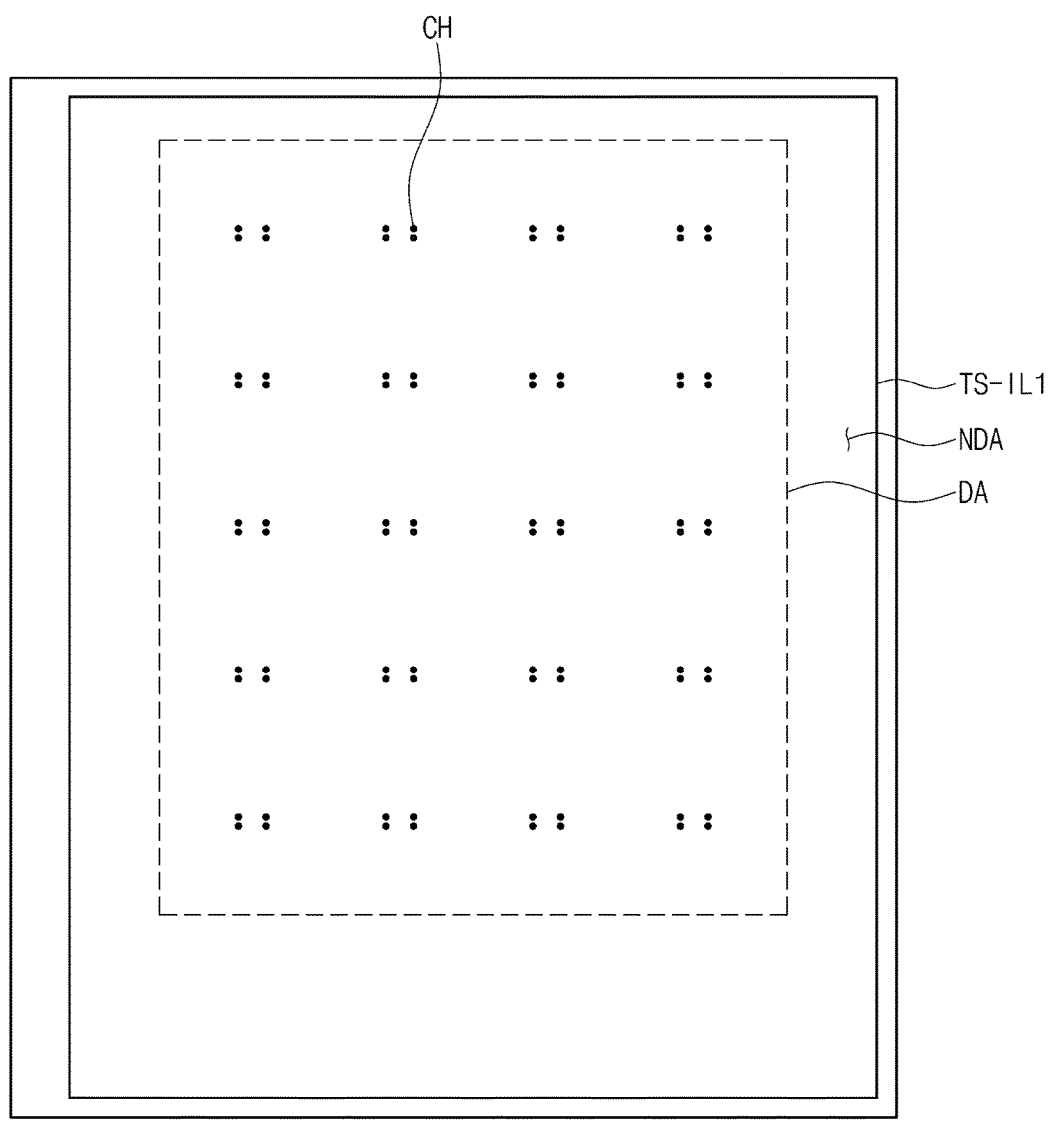

As shown in FIG. 9D, a first touch insulation layer TS-IL1 for covering the bridge patterns CP2 is located on the thin film sealing layer TFE. Contact holes CH for partially exposing the bridge patterns CP2 are defined in the first touch insulation layer TS-IL1. The contact holes CH may be formed through a photolithograph process.

Figure 9E:
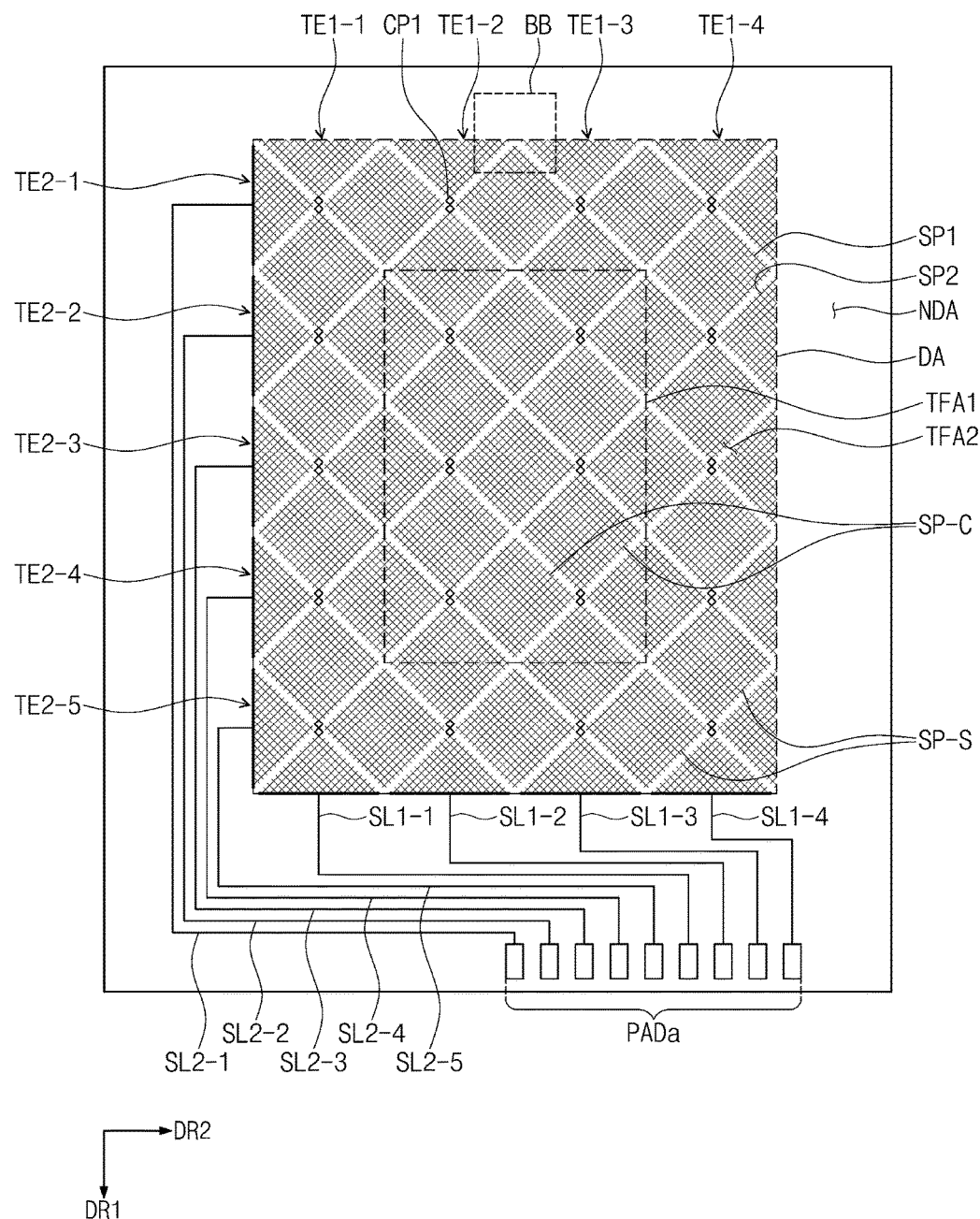

As shown in FIG. 9E, second conductive patterns are located on the first touch insulation layer TS-IL1. The second conductive patterns may include the plurality of first touch sensor parts SP1, the plurality of first connection parts CP1 and first touch signal lines SL1-1 to SL1-4, and may also include the plurality of second touch sensor parts SP2 and second touch signal lines SL2-1 to SL2-5. In some embodiments, a second touch insulation layer TS-IL2 for converting the second conductive patterns is located on the first touch insulation layer TS-IL1.

According to another embodiment of the inventive concept, the first conductive patterns may include the first touch electrodes TE1-1 to TE1-4 and the first touch signal lines SL1-1 to SL1-4. The second conductive patterns may include the second touch electrodes TE2-1 to TE2-5 and the second touch signal lines SL2-1 to SL2-5. At this point, the contact holes CH are not defined in the first touch insulation layer TS-IL1.

Additionally, according to an embodiment of the inventive concept, the first conductive patterns and the second conductive patterns may be interchanged. That is, the second conductive patterns may include the bridge patterns CP2.

Figure 9F:
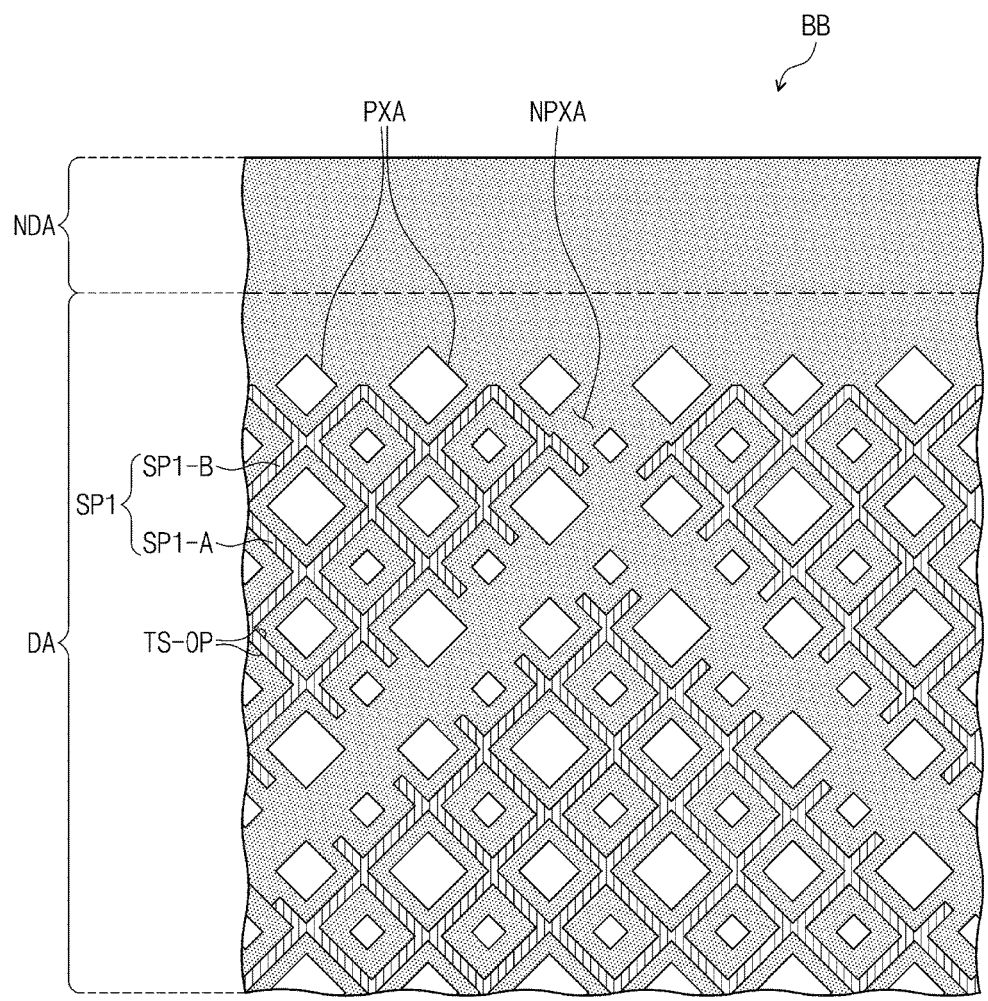
FIG. 9F is a partially enlarged view of an area BB of FIG. 9E.

FIG. 9F is a partially enlarged view of an area BB of FIG. 9E.

As shown in FIG. 9F, a first touch sensor part SP1 overlaps a non-light emitting area NPXA. The first touch sensor part SP1 includes a plurality of first extension parts SP1-A extending in a fifth direction DR5 intersecting the first direction DR1 and the second direction DR2, and also includes a plurality of second extension parts SP1-B extending in a sixth direction DR6 intersecting the fifth direction DR5. The plurality of first extension parts SP1-A and the plurality of second extension parts SP1-B may be defined by mesh lines. A line width of the mesh lines may be several micrometers.

The plurality of first extension parts SP1-A and the plurality of second extension parts SP1-B are connected to each other to form a plurality of touch opening parts TS-OP. That is, the first touch sensor part SP1 has a mesh form including the plurality of touch opening parts TS-OP. Although it is shown that each of the touch opening parts TS-OP respectively correspond to one of the light emitting areas PXA, the inventive concept is not limited thereto. For example, one touch opening part TS-OP may correspond to two or more light emitting areas PXA.

The sizes of the light emitting areas PXA may vary. For example, the sizes of light emitting areas PXA for providing blue light and light emitting areas PXA for providing red light among the light emitting areas PXA may vary. Accordingly, the sizes of the touch opening parts TS-OP may also vary. Although it is shown in FIG. 9F that the sizes of the light emitting areas PXA vary, the inventive concept is not limited thereto. The sizes of the light emitting areas PXA may be identical to each other and the sizes of the touch opening parts TS-OP may be also identical to each other.

Figure 10:
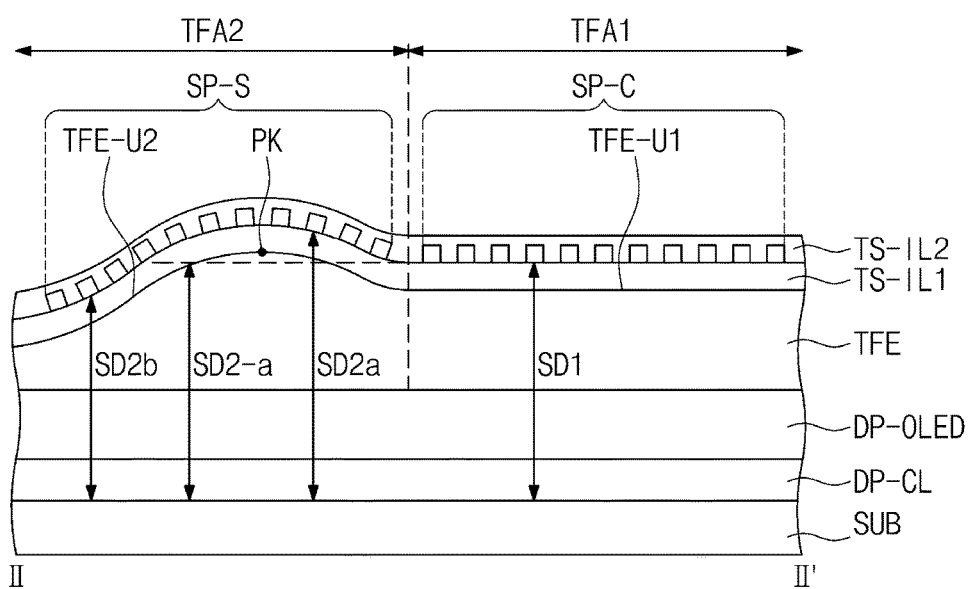
FIG. 10 is a sectional view taken along the line II-II' of FIG. 9B.

FIG. 10 is a sectional view taken along the line II-II' of FIG. 9B.

Referring to FIG. 10, it shows a section of one first sensor part SP-C located on a thin film sealing layer TFE and one second sensor part SP-S located on the thin film sealing layer TFE. The first sensor part SP-C may be located on a first thin film sealing area TFA1 of the thin film sealing layer TFE and the second sensor part SP-S may be located on a second thin film sealing area TFA2 of the thin film sealing layer TFE. The first sensor part SP-C may have a form corresponding to the form of a first upper surface TFE-U1 of the thin film sealing layer TFE and the second sensor part SP-S may have a form corresponding to the form of a second upper surface TFE-U2 of the thin film sealing layer TFE. That is, the second sensor part SP-S may be curved in correspondence to the form of the second upper surface TFE-U2.

The width in the second direction DR2 of the second thin film sealing area TFA2 may be identical to the width in the second direction DR2 of one second sensor part SP-S. For example, the width in the second direction DR2 of the second thin film sealing area TFA2 may be 4 μm, and the width in the second direction DR2 of one second sensor part SP-S may be 4 μm. However, the inventive concept is not limited thereto.

A peak PK of the second thin film sealing area TFA2 may overlap the second sensor part SP-S on a plane. The position of the peak PK may be adjusted in an area overlapping the second sensor part SP-S on a plane.

An interval between each point in the first sensor part SP-C and the base layer SUB may be a first interval SD1. Because the first upper surface TFE-U1 is parallel to the base layer SUB, intervals between the first sensor part SP-C and the base layer SUB may be substantially identical to each other within an error range at each point. For example, the error range may be below several hundred nanometers. In more detail, the error range may be 500 nanometers or less.

An interval between each point in the second sensor part SP-S and the base layer SUB may vary. FIG. 10 shows intervals SD2a and SD2b between two points of the second sensor part SP-S and the base layer SUB. The intervals SD2a and SD2b may be different at the two points.

An organic layer of the thin film sealing layer TFE may be formed through an inkjet printing process. In this case, the thickness of an organic layer in an area adjacent to the non-display area NDA (see FIG. 5B) may be reduced according to the flow of the organic layer. When the thickness of the organic layer becomes thin, an interval between the touch detection unit TS located on the thin film sealing layer TFE and the light emitting device layer DP-OLED located on the base layer SUB may be closer. That is, a distance between the touch detection unit TS and the cathode CE (see FIG. 6C) where the second voltage ELVSS (see FIG. 6A) is applied may be shorter. In this case, there may occur a phenomenon that an electric field formed in the touch detection unit TS is more concentrated on the cathode CE (see FIG. 6C) than an upper part of the touch detection unit TS. Accordingly, as the thickness of an organic layer becomes thinner, the sensitivity of the touch detection unit TS may be further deteriorated.

According to an embodiment of the inventive concept, to compensate for the thin thickness of the thin film sealing layer TFE, the thickness of the thin film sealing layer TFE overlapping the second thin film sealing area TFA2 may be adjusted. For example, the thin film sealing layer TFE may be allowed to have a convex form in the second thin film sealing area TFA2 by adjusting the amount of a composition including a monomer printed in an area adjacent to the non-display area NDA (see FIG. 5B) or adjusting a printing time. By adjusting the thickness of the second thin film sealing area TFA2, an average interval SD2-a between each point of the second sensor part SP-S and the base layer SUB may be adjusted to be substantially identical to the first interval SD1 between the first sensor part SP-C and the base layer SUB within a predetermined error range. The predetermined error range may be below several hundred nanometers. In more detail, the predetermined error range may be below 500 nanometers. As a result, a difference between a touch sensitivity of the second sensor part SP-S and a touch sensitivity of the first sensor part SP-C may be reduced, and the touch detection unit TS having uniform touch sensitivity may be provided.

According to an embodiment of the inventive concept, the thickness of an organic layer of a thin film sealing layer is adjusted. Therefore, a touch sensitivity deviation of a touch detection unit otherwise caused by thickness changes in a thin film sealing layer may be controlled.

Although various embodiments of the present invention have been described, it is understood that the present invention should not be limited to these embodiments, and that various changes and modifications can be made by one ordinary skilled in the art within the spirit and scope of the present invention as hereinafter claimed by the claims and their functional equivalents.

What is claimed is:

1. A display device comprising:
    an organic light emitting display panel defining a display area for displaying an image and a non-display area adjacent the display area, and comprising:

a base layer;
a circuit layer on the base layer;
a light emitting device layer on the circuit layer; and
a thin film sealing layer on the light emitting device layer and defining a first thin film sealing area, and a second thin film sealing area adjacent the first thin film sealing area; and
a touch detection unit comprising:
a first sensor part on the first thin film sealing area of the thin film sealing layer; and
a second sensor part on the second thin film sealing area of the thin film sealing layer,
wherein an upper surface of the thin film sealing layer that faces the touch detection unit comprises a first upper surface corresponding to the first thin film sealing area, and a second upper surface corresponding to the second thin film sealing area and protruding away from the base layer.

2. The display device of claim 1, wherein the touch detection unit is directly on the thin film sealing layer.

3. The display device of claim 1, wherein the first thin film sealing area and the second thin film sealing area overlap the display area on a plane, and
wherein the second thin film sealing area is between the first thin film sealing area and the non-display area on a plane.

4. The display device of claim 1, wherein the second sensor part is curved corresponding to a form of the second upper surface.

5. The display device of claim 1, wherein an average distance between the first upper surface and the base layer is a first distance, and
wherein a maximum distance between the second upper surface and the base layer is a second distance that is greater than the first distance.

6. The display device of claim 5, wherein a minimum distance between the second upper surface and the base layer is a third distance that is less than the first distance.

7. The display device of claim 1, wherein an average interval between each of a plurality of points in the first sensor part and the base layer is a first interval, and
wherein an average interval between each of a plurality of points in the second sensor part and the base layer is substantially identical to the first interval.

8. The display device of claim 1, wherein the thin film sealing layer comprises:
a first inorganic layer on the light emitting device layer;
a first organic layer on the first inorganic layer; and
a second inorganic layer on the first organic layer.

9. The display device of claim 8, wherein an upper surface of the first organic layer contacting the second inorganic layer comprises:
a first surface corresponding to the first thin film sealing area; and
a second surface corresponding to the second thin film sealing area and protruding away from the base layer.

10. The display device of claim 8, wherein the thin film sealing layer further comprises:
a second organic layer on the second inorganic layer; and
a third inorganic layer on the second organic layer.

11. The display device of claim 10, wherein an upper surface of at least one of the first organic layer and the second organic layer comprises:
a first surface corresponding to the first thin film sealing area; and
a second surface corresponding to the second thin film sealing area and protruding away from the base layer.

12. The display device of claim 8, wherein the thin film sealing layer further comprises an organic coating layer between the second inorganic layer and the second sensor part, the organic coating layer corresponding to the second thin film sealing area and comprising an upper surface protruding away from the base layer.

13. The display device of claim 1, wherein the first sensor part and the second sensor part are on the same layer.

14. The display device of claim 1, wherein the second upper surface of the thin film sealing layer comprises:
a peak having the furthest distance from the base layer;
a first inclined surface connecting the first upper surface and the peak and extending away from the base layer; and
a second inclined surface extending from the peak to the base layer.

15. The display device of claim 14, wherein the second thin film sealing area surrounds the first thin film sealing area, and
wherein the peak overlaps the second sensor part.

16. A display device comprising:
a base layer;
a circuit layer on the base layer;
a light emitting device layer on the circuit layer;
a thin film sealing layer on the light emitting device layer, and comprising a first upper surface and a second upper surface having a peak that protrudes from a reference surface, which is an extension of the first upper surface, in a direction away from the base layer;
a first sensor part on the first upper surface; and
a second sensor part on the second upper surface, curved corresponding to a form of the second upper surface, and overlapping the peak.

17. The display device of claim 16, wherein the second upper surface surrounds the first upper surface on a plane.

18. The display device of claim 16, wherein an average distance between the first upper surface and the base layer is a first distance,
wherein a distance between the peak and the base layer is a second distance that is greater than the first distance, and
wherein a minimum distance between the second upper surface and the base layer is a third distance that is less than the first distance.

19. The display device of claim 16, wherein the thin film sealing layer comprises at least one organic layer, and
wherein a form of the second upper surface corresponds to the at least one organic layer.

20. The display device of claim 16, wherein the first sensor part and the second sensor part are on the same layer.

21. A display device comprising:
an organic light emitting display panel, where a display area for displaying an image and a non-display area adjacent to the display area are defined, the organic light emitting display panel comprising a base layer, a circuit layer on the base layer, a light emitting device layer on the circuit layer, and a thin film sealing layer on the light emitting device layer and divided into a first thin film sealing area, and a second thin film sealing area adjacent to the first thin film sealing area; and
a touch detection unit comprising touch electrodes on the first thin film sealing area and the second thin film sealing area,
wherein the second thin film sealing area comprises a peak having a furthest distance from the base layer, and wherein a peripheral touch electrode closest to the non-display area among the touch electrodes overlaps the peak.

22. The display device of claim 21, wherein the touch electrodes comprise:
    M first touch electrodes extending along a first direction and arranged sequentially along a second direction crossing the first direction; and
    N second touch electrodes extending along the second direction and arranged sequentially along the first direction, and
    wherein the peak overlaps a 1st first touch electrode and an Mth first touch electrode of the M first touch electrodes.

23. The display device of claim 22, wherein the peak overlaps a 1st second touch electrode and an Nth second touch electrode of the N second touch electrodes.

24. The display device of claim 21,
    wherein a distance between the peak and the base layer is greater than an average distance between an upper surface of the first thin film sealing area facing the touch detection unit and the base layer.

25. The display device of claim 21, wherein the thin film sealing layer comprises at least one organic layer, and
    wherein the peak is provided by adjusting a thickness of the organic layer.

* * * * *